US009786841B2

(12) United States Patent
Siddik et al.

(10) Patent No.: US 9,786,841 B2
(45) Date of Patent: Oct. 10, 2017

(54) SEMICONDUCTOR DEVICES WITH MAGNETIC REGIONS AND ATTRACTER MATERIAL AND METHODS OF FABRICATION

(71) Applicant: Micron Technology, Inc., Boise, ID (US)

(72) Inventors: Manzar Siddik, Boise, ID (US); Andy Lyle, Boise, ID (US); Witold Kula, Gilroy, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/468,225

(22) Filed: Mar. 24, 2017

(65) Prior Publication Data

US 2017/0200887 A1    Jul. 13, 2017

Related U.S. Application Data

(63) Continuation of application No. 14/030,763, filed on Sep. 18, 2013, now Pat. No. 9,608,197.

(51) Int. Cl.
*H01L 43/12* (2006.01)
*H01L 43/10* (2006.01)
*H01L 43/08* (2006.01)

(52) U.S. Cl.
CPC .............. *H01L 43/12* (2013.01); *H01L 43/08* (2013.01); *H01L 43/10* (2013.01)

(58) Field of Classification Search
CPC .......... H01L 43/12; H01L 43/08; H01L 43/10
See application file for complete search history.

(56) References Cited

U.S. PATENT DOCUMENTS

| 4,882,936 A | 11/1989 | Garshelis |
| 5,551,586 A | 9/1996 | Uenoyama et al. |

(Continued)

FOREIGN PATENT DOCUMENTS

| CN | 101461064 A | 6/2009 |
| CN | 102246327 A | 11/2011 |

(Continued)

OTHER PUBLICATIONS

Ando et al., Electrically Tunable Spin Injector Free from the Impedance Mismatch Problem, Nature Materials, vol. 10 (Sep. 2011), pp. 655-659.

(Continued)

*Primary Examiner* — William Coleman
(74) *Attorney, Agent, or Firm* — TraskBritt

(57) ABSTRACT

A magnetic cell includes an attracter material proximate to a magnetic region (e.g., a free region). The attracter material is formulated to have a higher chemical affinity for a diffusible species of a magnetic material, from which the magnetic region is formed, compared to a chemical affinity between the diffusible species and at least another species of the magnetic material. Thus, the diffusible species is removed from the magnetic material to the attracter material. The removal accommodates crystallization of the depleted magnetic material. The crystallized, depleted magnetic material enables a high tunnel magnetoresistance, high energy barrier, and high energy barrier ratio. The magnetic region may be formed as a continuous magnetic material, thus enabling a high exchange stiffness, and positioning the magnetic region between two magnetic anisotropy-inducing oxide regions enables a high magnetic anisotropy strength. Methods of fabrication and semiconductor devices are also disclosed.

20 Claims, 15 Drawing Sheets

(56) References Cited

U.S. PATENT DOCUMENTS

| | | |
|---|---|---|
| 5,563,000 A | 10/1996 | Hatwar et al. |
| 5,583,725 A | 12/1996 | Coffey et al. |
| 5,604,030 A | 2/1997 | Yamane et al. |
| 5,768,069 A | 6/1998 | Mauri |
| 6,166,948 A | 12/2000 | Parkin et al. |
| 6,258,470 B1 | 7/2001 | Sakakima et al. |
| 6,275,363 B1 | 8/2001 | Gill |
| 6,347,049 B1 | 2/2002 | Childress et al. |
| 6,363,000 B2 | 3/2002 | Perner et al. |
| 6,387,476 B1 | 5/2002 | Iwasaki et al. |
| 6,483,741 B1 | 11/2002 | Iwasaki et al. |
| 6,560,135 B2 | 5/2003 | Matsuoka et al. |
| 6,569,545 B1 | 5/2003 | Kanbe et al. |
| 6,611,405 B1 | 8/2003 | Inomata et al. |
| 6,653,704 B1 | 11/2003 | Gurney et al. |
| 6,703,249 B2 | 3/2004 | Okazawa et al. |
| 6,771,534 B2 | 8/2004 | Stipe |
| 6,806,096 B1 | 10/2004 | Kim et al. |
| 6,845,038 B1 | 1/2005 | Shukh |
| 6,955,857 B2 | 10/2005 | Kubota et al. |
| 6,964,819 B1 | 11/2005 | Girt et al. |
| 6,970,376 B1 | 11/2005 | Fukuzumi |
| 6,980,468 B1 | 12/2005 | Ounadjela |
| 6,992,359 B2 | 1/2006 | Nguyen et al. |
| 6,998,150 B2 | 2/2006 | Li et al. |
| 7,026,671 B2 | 4/2006 | Mizuguchi et al. |
| 7,095,933 B2 | 8/2006 | Barth |
| 7,130,167 B2 | 10/2006 | Gill |
| 7,189,583 B2 | 3/2007 | Drewes |
| 7,230,265 B2 | 6/2007 | Kaiser et al. |
| 7,239,489 B2 | 7/2007 | Lin et al. |
| 7,274,080 B1 | 9/2007 | Parkin |
| 7,372,674 B2 | 5/2008 | Gill |
| 7,378,698 B2 | 5/2008 | Ha et al. |
| 7,379,280 B2 | 5/2008 | Fukumoto et al. |
| 7,486,552 B2 | 2/2009 | Apalkov et al. |
| 7,488,609 B1 | 2/2009 | Lin et al. |
| 7,514,160 B2 | 4/2009 | Nagahama et al. |
| 7,563,486 B2 | 7/2009 | Barth |
| 7,564,152 B1 | 7/2009 | Clark et al. |
| 7,602,033 B2 | 10/2009 | Zhao et al. |
| 7,660,153 B2 | 2/2010 | Yamane et al. |
| 7,682,841 B2 | 3/2010 | Dahmani et al. |
| 7,732,881 B2 | 6/2010 | Wang |
| 7,750,421 B2 | 7/2010 | Horng et al. |
| 7,791,844 B2 | 9/2010 | Carey et al. |
| 7,835,173 B2 | 11/2010 | Ma et al. |
| 7,863,060 B2 | 1/2011 | Belen et al. |
| 7,885,105 B2 | 2/2011 | Li et al. |
| 7,919,794 B2 | 4/2011 | Gu et al. |
| 7,929,370 B2 | 4/2011 | Min |
| 7,932,572 B2 | 4/2011 | Tsujiuchi |
| 7,948,044 B2 | 5/2011 | Horng et al. |
| 8,009,465 B2 | 8/2011 | Nakayama et al. |
| 8,043,732 B2 | 10/2011 | Anderson et al. |
| 8,048,492 B2 | 11/2011 | Fukuzawa et al. |
| 8,068,317 B2 | 11/2011 | Gill |
| 8,080,432 B2 | 12/2011 | Horng et al. |
| 8,089,137 B2 | 1/2012 | Lung et al. |
| 8,102,700 B2 | 1/2012 | Liu et al. |
| 8,120,949 B2 | 2/2012 | Ranjan et al. |
| 8,138,561 B2 | 3/2012 | Horng et al. |
| 8,223,539 B2 | 7/2012 | Smythe et al. |
| 8,324,697 B2 | 12/2012 | Worledge |
| 8,334,148 B2 | 12/2012 | Jeong et al. |
| 8,338,004 B2 | 12/2012 | Shin et al. |
| 8,357,962 B2 | 1/2013 | Marukame et al. |
| 8,385,107 B2 | 2/2013 | Prejbeanu |
| 8,411,498 B2 | 4/2013 | Kim et al. |
| 8,422,286 B2 | 4/2013 | Ranjan et al. |
| 8,470,462 B2 | 6/2013 | Horng et al. |
| 8,487,390 B2 | 7/2013 | Dimitrov et al. |
| 8,492,169 B2 | 7/2013 | Cao et al. |
| 8,514,527 B2 | 8/2013 | Komagaki et al. |
| 8,570,798 B2 | 10/2013 | Meade et al. |
| 8,587,043 B2 | 11/2013 | Natori et al. |
| 8,604,573 B2 | 12/2013 | Yamakawa et al. |
| 8,623,452 B2 | 1/2014 | Zhou |
| 8,692,342 B2 | 4/2014 | Oh et al. |
| 8,704,320 B2 | 4/2014 | Zhu et al. |
| 8,749,003 B2 | 6/2014 | Horng et al. |
| 8,766,341 B2 | 7/2014 | Han et al. |
| 8,779,538 B2 | 7/2014 | Chen et al. |
| 8,790,798 B2 | 7/2014 | Shukh |
| 8,803,265 B2 | 8/2014 | Lim et al. |
| 8,812,803 B2 | 8/2014 | Tsuchiya et al. |
| 8,823,118 B2 | 9/2014 | Horng et al. |
| 8,923,038 B2 | 12/2014 | Kula et al. |
| 9,269,888 B2 | 2/2016 | Meade et al. |
| 9,373,780 B2 | 6/2016 | Jan et al. |
| 9,466,789 B2 | 10/2016 | Wang et al. |
| 9,472,752 B2 | 10/2016 | Wang et al. |
| 2001/0024853 A1 | 9/2001 | Wallace et al. |
| 2002/0089874 A1 | 7/2002 | Nickel et al. |
| 2002/0097534 A1 | 7/2002 | Sun et al. |
| 2002/0105827 A1 | 8/2002 | Redon et al. |
| 2002/0114112 A1 | 8/2002 | Nakashio et al. |
| 2003/0011939 A1 | 1/2003 | Gill |
| 2003/0030434 A1 | 2/2003 | Hasegawa et al. |
| 2003/0035255 A1 | 2/2003 | Hasegawa et al. |
| 2003/0063415 A1 | 4/2003 | Hasegawa et al. |
| 2003/0064569 A1 | 4/2003 | Takayama et al. |
| 2003/0103371 A1 | 6/2003 | Kim et al. |
| 2003/0199104 A1 | 10/2003 | Leuschner et al. |
| 2004/0008455 A1 | 1/2004 | Hasegawa et al. |
| 2004/0075959 A1 | 4/2004 | Gill |
| 2004/0091744 A1 | 5/2004 | Carey et al. |
| 2004/0144995 A1 | 7/2004 | Nagahama et al. |
| 2004/0174740 A1 | 9/2004 | Lee et al. |
| 2004/0224243 A1 | 11/2004 | Yoshizawa et al. |
| 2004/0233760 A1 | 11/2004 | Guo et al. |
| 2004/0246776 A1 | 12/2004 | Covington |
| 2005/0019608 A1 | 1/2005 | Kim et al. |
| 2005/0024786 A1 | 2/2005 | Gill et al. |
| 2005/0036361 A1 | 2/2005 | Fukuzumi |
| 2005/0068683 A1 | 3/2005 | Gill |
| 2005/0087511 A1 | 4/2005 | Sharma et al. |
| 2005/0106810 A1 | 5/2005 | Pakala et al. |
| 2005/0164414 A1 | 7/2005 | Deak |
| 2005/0173698 A1 | 8/2005 | Drewes |
| 2005/0189574 A1 | 9/2005 | Nguyen et al. |
| 2005/0211973 A1 | 9/2005 | Mori et al. |
| 2005/0230743 A1 | 10/2005 | Nakagawa et al. |
| 2005/0231853 A1 | 10/2005 | Li et al. |
| 2005/0233174 A1 | 10/2005 | Munteanu et al. |
| 2005/0276099 A1 | 12/2005 | Horng et al. |
| 2006/0002039 A1 | 1/2006 | Hasegawa et al. |
| 2006/0038213 A1 | 2/2006 | Mori et al. |
| 2006/0042930 A1 | 3/2006 | Mauri |
| 2006/0098354 A1 | 5/2006 | Parkin |
| 2006/0114714 A1 | 6/2006 | Kanegae |
| 2006/0118842 A1 | 6/2006 | Iwata |
| 2006/0261425 A1 | 11/2006 | Suemitsu et al. |
| 2007/0008661 A1 | 1/2007 | Min et al. |
| 2007/0026263 A1 | 2/2007 | Kubota et al. |
| 2007/0035890 A1 | 2/2007 | Sbiaa |
| 2007/0053112 A1 | 3/2007 | Papworth Parkin |
| 2007/0086121 A1 | 4/2007 | Nagase et al. |
| 2007/0132003 A1 | 6/2007 | Takashima et al. |
| 2007/0217071 A1 | 9/2007 | Inamura et al. |
| 2007/0253116 A1 | 11/2007 | Takahashi |
| 2007/0297220 A1 | 12/2007 | Yoshikawa et al. |
| 2008/0164502 A1 | 7/2008 | Fukumoto et al. |
| 2008/0164548 A1 | 7/2008 | Ranjan et al. |
| 2008/0170329 A1 | 7/2008 | Thangaraj et al. |
| 2008/0179699 A1 | 7/2008 | Horng et al. |
| 2008/0182131 A1 | 7/2008 | Iwasaki |
| 2008/0205130 A1 | 8/2008 | Sun et al. |
| 2008/0225581 A1 | 9/2008 | Yamane et al. |
| 2008/0242088 A1 | 10/2008 | Suzuki |
| 2008/0253039 A1 | 10/2008 | Nagamine et al. |
| 2008/0278867 A1 | 11/2008 | Fukumoto et al. |
| 2009/0039450 A1 | 2/2009 | Lee et al. |
| 2009/0079018 A1 | 3/2009 | Nagase et al. |

(56) References Cited

U.S. PATENT DOCUMENTS

| | | |
|---|---|---|
| 2009/0096043 A1 | 4/2009 | Min et al. |
| 2009/0108383 A1 | 4/2009 | Horng et al. |
| 2009/0168238 A1 | 7/2009 | Kim et al. |
| 2009/0180215 A1 | 7/2009 | Ishikawa et al. |
| 2009/0190262 A1 | 7/2009 | Murakami et al. |
| 2009/0195924 A1 | 8/2009 | Nemoto et al. |
| 2009/0218645 A1 | 9/2009 | Ranjan et al. |
| 2009/0229111 A1 | 9/2009 | Zhao et al. |
| 2009/0231909 A1 | 9/2009 | Dieny et al. |
| 2009/0250776 A1 | 10/2009 | Takenaga et al. |
| 2009/0251829 A1 | 10/2009 | Zhang et al. |
| 2009/0257151 A1 | 10/2009 | Zhang et al. |
| 2010/0034014 A1 | 2/2010 | Ohno et al. |
| 2010/0035085 A1 | 2/2010 | Jung et al. |
| 2010/0080036 A1 | 4/2010 | Liu et al. |
| 2010/0080048 A1 | 4/2010 | Liu et al. |
| 2010/0086809 A1 | 4/2010 | Kuboki |
| 2010/0096716 A1 | 4/2010 | Ranjan et al. |
| 2010/0102406 A1 | 4/2010 | Xi et al. |
| 2010/0109110 A1 | 5/2010 | Wang et al. |
| 2010/0110783 A1 | 5/2010 | Liu et al. |
| 2010/0140726 A1 | 6/2010 | Apalkov et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0219491 A1 | 9/2010 | Lee et al. |
| 2010/0220516 A1 | 9/2010 | Lee et al. |
| 2010/0230769 A1 | 9/2010 | Ozaki et al. |
| 2010/0240151 A1 | 9/2010 | Belen et al. |
| 2010/0276771 A1 | 11/2010 | Fukumoto et al. |
| 2010/0327248 A1 | 12/2010 | Khoueir et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Watts et al. |
| 2011/0049657 A1 | 3/2011 | Tsukamoto et al. |
| 2011/0049658 A1 | 3/2011 | Zheng et al. |
| 2011/0051503 A1 | 3/2011 | Hu et al. |
| 2011/0062537 A1 | 3/2011 | Oh et al. |
| 2011/0064969 A1 | 3/2011 | Chen et al. |
| 2011/0086439 A1 | 4/2011 | Choi |
| 2011/0096443 A1 | 4/2011 | Zhang et al. |
| 2011/0121366 A1 | 5/2011 | Or-Bach et al. |
| 2011/0145514 A1 | 6/2011 | Lee et al. |
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0151280 A1 | 6/2011 | Takahashi et al. |
| 2011/0170339 A1 | 7/2011 | Wunderlich et al. |
| 2011/0170341 A1 | 7/2011 | Butler |
| 2011/0194329 A1 | 8/2011 | Ohba et al. |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0298456 A1 | 12/2011 | Lu et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1 | 1/2012 | Yamada et al. |
| 2012/0015099 A1 | 1/2012 | Sun et al. |
| 2012/0018823 A1 | 1/2012 | Huai et al. |
| 2012/0018825 A1 | 1/2012 | Lim et al. |
| 2012/0023386 A1 | 1/2012 | Oh et al. |
| 2012/0040207 A1 | 2/2012 | Horng et al. |
| 2012/0061781 A1 | 3/2012 | Ohmori et al. |
| 2012/0068139 A1 | 3/2012 | Daibou et al. |
| 2012/0069647 A1 | 3/2012 | Kramer et al. |
| 2012/0074511 A1 | 3/2012 | Takahashi et al. |
| 2012/0075922 A1 | 3/2012 | Yamada et al. |
| 2012/0075927 A1 | 3/2012 | Chen et al. |
| 2012/0106233 A1 | 5/2012 | Katti |
| 2012/0112297 A1 | 5/2012 | Yamakawa et al. |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0164485 A1 | 6/2012 | Lin |
| 2012/0181537 A1 | 7/2012 | Cao et al. |
| 2012/0205758 A1 | 8/2012 | Jan et al. |
| 2012/0217594 A1 | 8/2012 | Kajiyama |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0261777 A1 | 10/2012 | Shukh |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2013/0005052 A1 | 1/2013 | Hu et al. |
| 2013/0015539 A1 | 1/2013 | Choi |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0043471 A1 | 2/2013 | Cao et al. |
| 2013/0059168 A1 | 3/2013 | Tahmasebi et al. |
| 2013/0064011 A1 | 3/2013 | Liu et al. |
| 2013/0069185 A1 | 3/2013 | Saida et al. |
| 2013/0075839 A1 | 3/2013 | Chen et al. |
| 2013/0134534 A1 | 5/2013 | Sbiaa et al. |
| 2013/0140658 A1 | 6/2013 | Yamane et al. |
| 2013/0146996 A1 | 6/2013 | Yu et al. |
| 2013/0148418 A1 | 6/2013 | Luo et al. |
| 2013/0177781 A1 | 7/2013 | Chepulskyy et al. |
| 2013/0209836 A1 | 8/2013 | Ataka et al. |
| 2013/0221459 A1 | 8/2013 | Jan et al. |
| 2013/0224521 A1 | 8/2013 | Wang et al. |
| 2013/0228884 A1 | 9/2013 | Zheng et al. |
| 2013/0229866 A1 | 9/2013 | Ranjan et al. |
| 2013/0242435 A1 | 9/2013 | Fuji et al. |
| 2013/0250661 A1 | 9/2013 | Sandhu et al. |
| 2013/0288392 A1 | 10/2013 | Nozieres et al. |
| 2013/0313665 A1 | 11/2013 | Rhie et al. |
| 2013/0314815 A1 | 11/2013 | Yuan et al. |
| 2013/0334631 A1 | 12/2013 | Kinney et al. |
| 2014/0008742 A1 | 1/2014 | Chen et al. |
| 2014/0015076 A1 | 1/2014 | Gan et al. |
| 2014/0021426 A1 | 1/2014 | Lee et al. |
| 2014/0027869 A1 | 1/2014 | Lee et al. |
| 2014/0038312 A1 | 2/2014 | Lee et al. |
| 2014/0063656 A1 | 3/2014 | Hashimoto |
| 2014/0064047 A1 | 3/2014 | Niwa et al. |
| 2014/0070341 A1 | 3/2014 | Beach et al. |
| 2014/0084398 A1 | 3/2014 | Oguz et al. |
| 2014/0099735 A1 | 4/2014 | Horng et al. |
| 2014/0116984 A1 | 5/2014 | Ding et al. |
| 2014/0151843 A1 | 6/2014 | Millward et al. |
| 2014/0217526 A1 | 8/2014 | Guo |
| 2014/0242419 A1 | 8/2014 | Singh et al. |
| 2014/0264663 A1 | 9/2014 | Chen et al. |
| 2014/0268301 A1 | 9/2014 | Ding et al. |
| 2014/0269064 A1 | 9/2014 | Jeon et al. |
| 2014/0272454 A1 | 9/2014 | Zhang et al. |
| 2014/0293436 A1 | 10/2014 | Nagahama et al. |
| 2014/0308542 A1 | 10/2014 | Zhang et al. |
| 2014/0327095 A1 | 11/2014 | Kim et al. |
| 2014/0334032 A1 | 11/2014 | Nishioka et al. |
| 2014/0339504 A1 | 11/2014 | Kim et al. |
| 2015/0028439 A1 | 1/2015 | Kula et al. |
| 2015/0069556 A1 | 3/2015 | Yamakawa et al. |
| 2015/0076485 A1 | 3/2015 | Sandhu et al. |
| 2015/0270478 A1 | 9/2015 | Annunziata et al. |
| 2015/0287910 A1 | 10/2015 | Lu et al. |
| 2015/0295164 A1 | 10/2015 | Sandhu et al. |
| 2015/0303372 A1 | 10/2015 | Meade et al. |
| 2015/0340601 A1 | 11/2015 | Huai et al. |

(56) References Cited

U.S. PATENT DOCUMENTS

| | | |
|---|---|---|
| 2016/0005954 A1 | 1/2016 | Erickson et al. |
| 2016/0086645 A1 | 3/2016 | Erickson et al. |
| 2016/0111632 A1 | 4/2016 | Sandhu et al. |
| 2016/0155932 A1 | 6/2016 | Chen et al. |

FOREIGN PATENT DOCUMENTS

| | | |
|---|---|---|
| CN | 102610270 A | 7/2012 |
| EP | 1353443 A2 | 10/2003 |
| EP | 2385548 A1 | 11/2011 |
| EP | 2541554 A1 | 1/2013 |
| EP | 2015307 B1 | 10/2013 |
| GB | 2343308 A | 5/2000 |
| JP | 2002314049 A | 10/2002 |
| JP | 2004104076 A | 4/2004 |
| JP | 2006165059 A | 6/2006 |
| JP | 2008270835 A | 11/2008 |
| JP | 2009194366 A | 8/2009 |
| JP | 2012244031 A | 12/2012 |
| JP | 2013145846 A | 7/2013 |
| KR | 1020040092342 A | 11/2004 |
| KR | 1020070094431 A | 9/2007 |
| KR | 1020080029852 A | 4/2008 |
| KR | 1020120008295 | 1/2012 |
| WO | 2010026831 A1 | 11/2010 |
| WO | 2010134378 A1 | 11/2010 |
| WO | 2011001746 A1 | 1/2011 |
| WO | 2011149274 A2 | 12/2011 |
| WO | 2011159422 A1 | 12/2011 |
| WO | 2012086183 A | 6/2012 |
| WO | 2012128891 A1 | 9/2012 |
| WO | 2012160937 A1 | 11/2012 |

OTHER PUBLICATIONS

Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).
Auwarter et al., Co on h-BN/Ni(1 1 1): From Island to Island-Chain Formation and Co Intercalation, Surface Science, vol. 511, (2002), pp. 379-386.
Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).
Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.
Butler et al., "Spin-Dependent Tunneling Conductance of Fe|MgO|Fe Sandwiches," Physical Review B, vol. 63, (Jan. 8, 2001), 054416-1-054416-12.
Carrey et al., Influence of Interface Alloying on the Magnetic Properties of Co/Pd Multilayers, Applied Physics Letters, vol. 83, No. 25, (Dec. 22, 2003), pp. 5259-5261.
Cha et al., Atomic-Scale Spectroscopic Imaging of CoFeB/Mg—B—O/CoFeB Magnetic Tunnel Junctions, Applied Physics Letters, vol. 95, (2009), pp. 032506-1-032506-3.
Chen et al., Magnetic Cell Structures, and Methods of Fabrication, U.S. Appl. No. 14/558,367, filed Dec. 2, 2014.
Chen et al., Advances and Future Prospects of Spin-Transfer Torque Random Access Memory, IEEE Transactions on Magnetics, vol. 46, No. 6, (Jun. 2010), pp. 1873-1878.
Diao et al., Spin Transfer Switching in Dual MgO Magnetic Tunnel Junctions, Applied Physics Letters, vol. 90, (2007), pp. 132508-1-132508-3.
Djayaprawira et al., 230% Room-Temperature Magnetoresistance in CoFeB/MgO/CoFeB Magnetic Tunnel Junctions, Applied Physics Letters, vol. 86, Issue 9, (2005), 2 pages (abstract only).
Farle et al., The Temperature Dependence of Magnetic Anisotropy in Ultra-Thin Films, Journal of Magnetism and Magnetic Materials, vol. 165, (1997), pp. 74-77.

Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.
Gao et al., Combinatorial Exploration of Rare-Earth-Free Permanent Magnets: Magnetic and Microstructural Properties of Fe—Co—W Thin Films, Applied Physics Letters, vol. 102, (2013), pp. 022419-1-022419-4.
Greenwood et al., Chemistry of Elements, Second Edition, (1997), pp. 23-25.
Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 44, No. 19, (2005), pp. L587-L589.
Heczko et al., Strain and Concurrent Magnetization Changes in Magnetic Shape Memory Ni—Mn—Ga Single Crystals—Experiment and Model, Materials Science and Engineering A, vol. 481-482, (2008), pp. 283-287.
Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.
Hindmarch et al., Zirconium as a Boron Sink in Crystalline CoFeB/MgO/CoFeB Magnetic Tunnel Junctions, the Japan Society of Applied Physics, 2011, pp. 1-3.
Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.
International Search Report for International Application No. PCT/US2014-054690, (dated Dec. 8, 2014), 3 pages.
International Written Opinion for International Application No. PCT/US2014-054690 dated Dec. 8, 2014, 6 pages.
Kaufman, Myron, "Principles of Thermodynamics," Taylor & Francis Group LLC, (2002), Chap. 7: Chemical Reactions, 9 pages.
Ke et al., Oxygen-Vacancy-Induced Diffusive Scattering in Fe/MgO/Fe Magnetic Tunnel Junctions, Physical Review Letters, vol. 105, (Nov. 30, 2010), pp. 236801-1-236801-4.
Kim et al., Effect of Annealing on Magnetic Exchange Coupling in CoPt/Co Bilayer Thin Films, Journal of Applied Physics, vol. 87, No. 9, (May 1, 2000), pp. 6140-6142.
Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), 1 page (abstract only).
Knovel, Knavel Sampler,(2003), http://app.knovel.com/web/view/html/show.v/rcid:kpKS000009/cid:kt003BCMZ2/viewerType:html/root_slug:front-matter/url_slug:front-matter?b-q=ioniz; 2 pages.
Ko et al., Effects of MgO and MgO/Pd Seed-Layers on Perpendicular Magnetic Anisotropy of CoPd Thin Films, Thin Solid Films, vol. 519, (2011), pp. 8252-8255.
Kohda et al., Width and Temperature Dependence of Lithography-Induced Magnetic Anisotropy in (Ga,Mn)As Wires, Physica E, vol. 42, (2010), pp. 2685-2689.
Kurt et al., Giant tunneling magnetoresistance with electron beam evaporated MgO barrier and CoFeB electrodes, Journal of Applied Physics, Apr. 2010, vol. 107, pp. 1-6.
Lavrijsen et al., Tuning the Interlayer Exchange Coupling Between Single Perpendicularly Magnetized CoFeB Layers, Appl. Phys. Lett., vol. 100, (2012), pp. 052411-1-052411-5.
Lee et al., Improved Magnetic Tunnel Junction With Amorphous Seed Layer, Surface Treatment, and High-Polarization Magnetic Materials, Jul. 2004, IEEE, IEEE Transactions on Magnetics, vol. 40. No. 4, all pages.
Löhndorf et al., Characterization of Magnetostrictive TMR Pressure Sensors by MOKE, Journal of Magnetism and Magnetic Materials, vol. 316, (2007), pp. e223-e225.
Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.

(56) References Cited

OTHER PUBLICATIONS

Maehara et al., Tunnel Magnetoresistance Above 170% and Resistance-Area Product of 1 O (μm)2 Attained by In Situ Annealing of Ultra-Thin MgO Tunnel Barrier, Applied Physics Express, vol. 4, (2011), 2 pages (abstract only).
Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.
Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.
Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.
Miao et al., Theoretical investigation on the transition-metal borides with Ta3B4-type structure: A class of hard and refractory materials, 2011, Computational Materials Science, Elsevier, pp. 1559-1566.
Miracle et al., An Assessment of Binary Metallic Glasses: Correlations Between Structure, Glass Forming Ability and Stability (Preprint), Air Force Research Laboratory, (2011), 97 pages.
Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.
Moroz et al., Modeling the Impact of Stress on Silicon Processes and Devices, Materials Science in Semiconductor Processing, vol. 6, (2003), pp. 27-36.
Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.
Nishitani et al., Magnetic Anisotropy in a Ferromagnetic (Ga,Mn)Sb Thin Film, Physica E, vol. 42, (2010), pp. 2681-2684.
Pinitsoontorn et al., "Three-dimensional atom probe investigation of boron distribution in CofeB/MgO/CoFeB magnetic tunnel junctions" Applied Physics Letters, vol. 93, American Institute of Physics, 2008, pp. 071901-1 to 071901-3.
Piramanayagam, S. N., Perpendicular Recording Media for Hard Disk Drives, Journal of Applied Physics, vol. 102, (2007), pp. 011301-1-011301-22.
Resnik et al., Mechanical Stress in Thin Film Microstructures on Silicon Substrate, Vacuum, vol. 80, (2005), pp. 236-240.
Rodmacq et al., Influence of Thermal Annealing on the Perpendicular Magnetic Anisotropy of Pt/Co/AlOx Trilayers, Physical Review B, vol. 79, (2009), pp. 024423-1-024423-8.
Sandhu et al., Memory Cells, Methods of Fabrication, Semiconductor Devices, Memory Systems, and Electronic Systems, U.S. Appl. No. 14/026,627, filed Sep. 13, 2013.
Sato et al., Perpendicular-Anisotropy CoFeB—MgO Magnetic Tunnel Junctions with a MgO/CoFeB/Ta/CoFeB/MgO Recording Structure, Applied Physics Letters, vol. 101, (2012), pp. 022414-1-022414-4.
Siddik et al., Semiconductor Devices, Magnetic Tunnel Junctions, and Methods of Fabrication Thereof, U.S. Appl. No. 14/597,903, filed Jan. 15, 2015.
Stone et al., Tuning of Ferromagnetism Through Anion Substitution in Ga—Mn-Pnictide Ferromagnetic Semiconductors, Physica B, vol. 401-402, (2007), pp. 454-457.
Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.
Tsunekawa et al., Effect of Capping Layer Material on Tunnel Magnetoresistance in CoFeB—MgO—CoFeB Magentic Tunnel Junctions, Digests of the IEEE International Magnetics Conference (Apr. 2005), pp. 1983-1984.
Taiwanese Office Action and Search Report for Taiwanese Application No. 103132306, (search completed Apr. 8, 2016), 12 pages (including translation).
Taiwanese Office Action for Taiwanese Application No. 103132306, (dated Nov. 9, 2016), 7 pages including English translation.
Vitos et al., The Surface Energy of Metals, Surface Science, vol. 411, (1998), pp. 186-202.
Wang et al., C-Spin Kickoff Meeting Presentation, Semiconductor Research Corp., (Mar. 26, 2013), Minneapolis, Minnesota, (available at https://www.src.org/library/publication/p066203/), 195 pages.
Wang et al., Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.
Wang et al., "Low-Power Non-volatile Spintronic Memory: STT-MRAM and Beyond," J. Phys. D: Applied Physics, vol. 46, (Jan. 31, 2013), pp. 1-10.
Wilson et al., New Materials for Micro-Scale Sensors and Actuators: An Engineering Review, Materials Science and Engineering R, vol. 56, (2007), pp. 1-129.
Worledge et al., Magnetoresistance Measurement of Unpatterned Magnetic Tunnel Junction Wafers by Current-in-Plane Tunneling, Applied Physics Letters, vol. 83, No. 1, (Jul. 7, 2013), pp. 84-86.
Worledge et al., Spin Torque Switching of Perpendicular Ta|CoFeB|MgO-Based Magnetic Tunnel Junctions, Applied Physics Letters, vol. 98, (2011), pp. 022501-1-022501-3.
Wu et al., Tuning Magnetic Anisotropies of Fe Films on Si(111) Substrate Via Direction Variation of Heating Current, Scientific Reports, vol. 3, (Mar. 26, 2013), pp. 1-5.
You et al., Spin Transfer Torque and Tunneling Magnetoresistance Dependences on Finite Bias Voltages and Insulator Barrier Energy, Thin Solid Films, vol. 519, (2011), pp. 8247-8251.
Yu et al., 1/f Noise in MgO Double-Barrier Magnetic Tunnel Junctions, Applied Physics Letters, vol. 98, (2011), pp. 112504-1-112504-3.
Zhang, Anisotropic Magnetomechanical Effect in Tb0.3Dy0.7Fe2 Alloy, Journal of Magnetism and Magnetic Materials, vol. 324, (2012), pp. 190-195.
Zhu et al., Magnetic Tunnel Junctions, MaterialsToday, vol. 9, No. 11, (Nov. 2006), pp. 36-45.
European Extended Search Report from European Application No. 14845286, (dated Apr. 12, 2017) (search completed Apr. 4, 2017), 6 pages.
Taiwanese Rejection Decision from Taiwanese Application No. 103132306, (dated Mar. 17, 2017), 7 pages including English translation.
Japanese Office Action from Japanese Application No. 2016-543925, (dated Jun. 6, 2017), 12 pages including English translation.
First Office Action for Chinese Patent Application No. 2014800517285, (dated Jul. 3, 2017), 21 pages including English translation.
First Search Report for Chinese Patent Application No. 2014800517285, (dated Jun. 23, 2017), 1 page.

SEMICONDUCTOR DEVICES WITH MAGNETIC REGIONS AND ATTRACTER MATERIAL AND METHODS OF FABRICATION

CROSS-REFERENCE TO RELATED APPLICATION

This application is a continuation of U.S. patent application Ser. No. 14/030,763, filed Sep. 18, 2013, now U.S. Pat. No. 9,608,197, issued Mar. 28, 2017, the disclosure of which is hereby incorporated herein in its entirety by this reference.

TECHNICAL FIELD

The present disclosure, in various embodiments, relates generally to the field of memory device design and fabrication. More particularly, this disclosure relates to design and fabrication of memory cells characterized as spin torque transfer magnetic random access memory (STT-MRAM) cells.

BACKGROUND

Magnetic Random Access Memory (MRAM) is a non-volatile computer memory technology based on magnetoresistance. One type of MRAM cell is a spin torque transfer MRAM (STT-MRAM) cell, which includes a magnetic cell core supported by a substrate. The magnetic cell core includes at least two magnetic regions, for example, a "fixed region" and a "free region," with a non-magnetic region between. The free region and the fixed region may exhibit magnetic orientations that are either horizontally oriented ("in-plane") or perpendicularly oriented ("out-of-plane") with the width of the regions. The fixed region includes a magnetic material that has a substantially fixed (e.g., a non-switchable) magnetic orientation. The free region, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration, the magnetic orientations of the fixed region and the free region are directed in opposite directions (e.g., north and south, east and west, south and north, or west and east, respectively). In the parallel configuration, the STT-MRAM cell exhibits a lower electrical resistance across the magnetoresistive elements (e.g., the fixed region and free region). This state of low electrical resistance may be defined as a "0" logic state of the MRAM cell. In the anti-parallel configuration, the STT-MRAM cell exhibits a higher electrical resistance across the magnetoresistive elements. This state of high electrical resistance may be defined as a "1" logic state of the STT-MRAM cell.

Switching of the magnetic orientation of the free region may be accomplished by passing a programming current through the magnetic cell core and the fixed and free regions therein. The fixed region polarizes the electron spin of the programming current, and torque is created as the spin-polarized current passes through the core. The spin-polarized electron current exerts the torque on the free region. When the torque of the spin-polarized electron current passing through the core is greater than a critical switching current density ($J_c$) of the free region, the direction of the magnetic orientation of the free region is switched. Thus, the programming current can be used to alter the electrical resistance across the magnetic regions. The resulting high or low electrical resistance states across the magnetoresistive elements enable the write and read operations of the MRAM cell. After switching the magnetic orientation of the free region to achieve the one of the parallel configuration and the anti-parallel configuration associated with a desired logic state, the magnetic orientation of the free region is usually desired to be maintained, during a "storage" stage, until the MRAM cell is to be rewritten to a different configuration (i.e., to a different logic state).

A magnetic region's magnetic anisotropy ("MA") is an indication of the directional dependence of the material's magnetic properties. Therefore, the MA is also an indication of the strength of the material's magnetic orientation and of its resistance to alteration of its orientation. A magnetic material exhibiting a magnetic orientation with a high MA strength may be less prone to alteration of its magnetic orientation than a magnetic material exhibiting a magnetic orientation with a low MA strength. Therefore, a free region with a high MA strength may be more stable during storage than a free region with a low MA strength.

Contact or near contact between certain nonmagnetic material (e.g., oxide material) and magnetic material may induce MA (e.g., increase MA strength) along a surface of the magnetic material, adding to the overall MA strength of the magnetic material and the MRAM cell. Generally, the greater the ratio of the magnetic material in contact with the surface/interface MA-inducing material to the non-contacted portion of the magnetic material, the higher the MA strength of the magnetic region. Therefore, generally, conventional magnetic cell structures directly contact the magnetic material of, e.g., the free region, to a neighboring MA-inducing oxide region, without another material between the magnetic material and the MA-inducing material.

Other beneficial properties of free regions are often associated with thick (i.e., a high, vertical dimension) free regions and with the microstructure of the free regions. These properties include, for example, the cell's tunnel magnetoresistance ("TMR"). TMR is a ratio of the difference between the cell's electrical resistance in the anti-parallel configuration ($R_{ap}$) and its resistance in the parallel configuration ($R_p$) to $R_p$ (i.e., TMR=$(R_{ap}-R_p)/R_p$). Generally, a thick free region with few structural defects in the microstructure of its magnetic material has a higher TMR than a thin free region with structural defects. A cell with high TMR may have a high read-out signal, which may speed the reading of the MRAM cell during operation. High TMR may also enable use of low programming current.

A thick, defect-free free region may also have a higher energy barrier (Eb) and higher energy barrier ratio (Eb/kT) compared to a thin, defect-including free region. The energy barrier ratio is a ratio of Eb to kT, wherein k is the Boltzmann constant and T is temperature. The Eb and the energy barrier ratio are indications of the cell's thermal stability and, therefore, its data retention. The higher the Eb and the higher the energy barrier ratio, the less prone the cell may be to premature switching (e.g., switching out of a programmed parallel or anti-parallel configuration during storage).

A defect-free free region that is "magnetically continuous" (i.e., not interrupted by non-magnetic material dispersed among magnetic material) may have a higher exchange stiffness than a defect-including, magnetically interrupted free region. Exchange stiffness ($A=E_{ex}/\alpha$, $E_{ex}$=exchange energy per atom, α=distance) is a property of a magnetic material. Generally, the higher the exchange stiffness of a magnetic material, the better the magnetic material may perform as a free region of an MRAM cell.

Efforts have been made to form free regions that have a high MA strength as well as a thickness conducive for high TMR, or other properties, by positioning a thick free region between two MA-inducing materials, doubling the surface area of the magnetic material exposed to the MA-inducing material. However, a conventional MA-inducing material may be electrically resistant. Therefore, including a second MA-inducing material region in the MRAM cell increases the electrical resistance of the magnetic cell core. Including a second MA-inducing material region in conventional MRAM cell structures may also lead to structural defects in the cell core. Accordingly, forming MRAM cell structures having high MA strength, high TMR, high energy barriers and energy barrier ratios, and high exchange stiffness has presented challenges.

DETAILED DESCRIPTION

Figure 1:
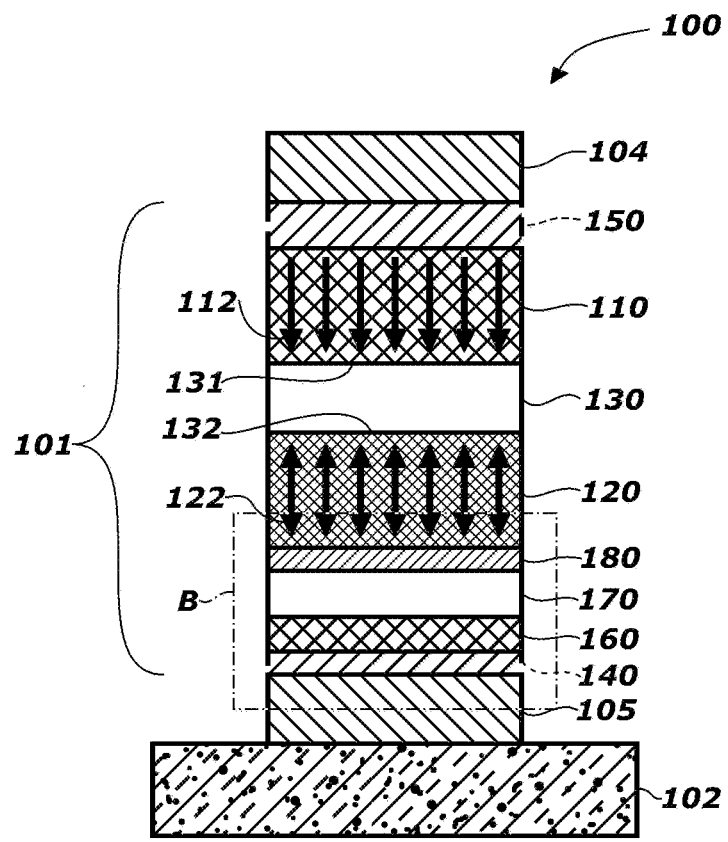
FIG. 1 is a cross-sectional, elevational, schematic illustration of a magnetic cell structure according to an embodiment of the present disclosure, wherein an attracter region is proximate to a secondary oxide region and a free region of the structure, the secondary oxide region underlying the free region and the attracter region.

Memory cells, methods of forming memory cells, semiconductor devices, memory systems, and electronic systems are disclosed. The memory cells include a magnetic region (e.g., a free region), formed from a magnetic material, between two oxide regions. Both oxide regions may be magnetic anisotropy ("MA")-inducing regions. The magnetic material, from which the magnetic region is formed, includes a "diffusible species" and at least one other species. The presence of the diffusible species in the magnetic material may not be necessary for the magnetic material to exhibit magnetism. An attracter material is proximate to the magnetic region and is formulated to have a higher chemical affinity for the diffusible species than a chemical affinity between the diffusible species and the at least one other species of the magnetic material. Thus, the proximity of the attracter material to the magnetic region leads to the diffusible species being removed from the magnetic material and incorporated into the attracter material, e.g., during an anneal. The removal of the diffusible species from the magnetic material may enable crystallization of the magnetic region with a desired crystalline structure (e.g., a bcc (001) crystalline structure) that promotes a high TMR (tunnel magnetoresistance) and includes few structural defects. Thus, the magnetic region may be formed to be thick (e.g., of a height that is greater than about 8 Å (about 0.8 nm), e.g., greater than about 10 Å (about 1.0 nm)), enabling a high energy barrier (Eb) and energy barrier ratio (Eb/kT). Furthermore, positioning the magnetic region between two MA-inducing oxide regions enables a high MA strength. The high MA strength may be achieved even in embodiments in which the attracter material is between the oxide material and the magnetic material. Additionally, the magnetic region may be formed as a continuous magnetic region, uninterrupted by non-magnetic material, enabling a high exchange stiffness.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes a magnetic cell structure that includes a magnetic cell core including a nonmagnetic region disposed between a free region and a fixed region. The nonmagnetic region may be an electrically insulative (e.g., dielectric) region, in a magnetic tunnel junction ("MTJ") configuration. For example, the nonmagnetic region, between the free and fixed regions, may be an oxide region (referred to herein as the "intermediate oxide region").

As used herein, the term "magnetic cell core" means and includes a memory cell structure comprising the free region and the fixed region and through which, during use and operation of the memory cell, current may be passed (i.e., flowed) to effect a parallel or anti-parallel configuration of the magnetic orientations of the free region and the fixed region.

As used herein, the term "magnetic region" means a region that exhibits magnetism. A magnetic region includes a magnetic material and may also include one or more non-magnetic materials.

As used herein, the term "magnetic material" means and includes ferromagnetic materials, ferrimagnetic materials, antiferromagnetic, and paramagnetic materials.

As used herein, the term "CoFeB material" means and includes a material comprising cobalt (Co), iron (Fe), and boron (B) (e.g., $Co_xFe_yB_z$, wherein x=10 to 80, y=10 to 80, and z=0 to 50). A CoFeB material may or may not exhibit magnetism, depending on its configuration (e.g., its thickness).

As used herein, the term "species" means and includes an element or elements composing a material. For example, and without limitation, in a CoFeB material, each of Co, Fe, and B may be referred to as species of the CoFeB material.

As used herein, the term "diffusible species" means and includes a chemical species of a material the presence of which in the material is not necessary for the functionality of the material. For example, and without limitation, in a CoFeB material of a magnetic region, B (boron) may be referred to as a diffusible species to the extent that the presence of B with Co and Fe is not necessary for the Co and Fe to function as a magnetic material (i.e., to exhibit magnetism). Following diffusion, the "diffusible species" may be referred to as a "diffused species."

As used herein, the term "fixed region" means and includes a magnetic region within the STT-MRAM cell that includes a magnetic material and that has a fixed magnetic orientation during use and operation of the STT-MRAM cell in that a current or applied field effecting a change in the magnetization direction of one magnetic region (e.g., the free region) of the cell core may not effect a change in the magnetization direction of the fixed region. The fixed region may include one or more magnetic materials and, optionally, one or more non-magnetic materials. For example, the fixed region may be configured as a synthetic antiferromagnet (SAF) including a sub-region of ruthenium (Ru) adjoined by magnetic sub-regions. Each of the magnetic sub-regions may include one or more materials and one or more regions therein. As another example, the fixed region may be configured as a single, homogeneous magnetic material. Accordingly, the fixed region may have uniform magnetization, or sub-regions of differing magnetization that, overall, effect the fixed region having a fixed magnetic orientation during use and operation of the STT-MRAM cell.

As used herein, the term "free region" means and includes a magnetic region within the STT-MRAM cell that includes a magnetic material and that has a switchable magnetic orientation during use and operation of the STT-MRAM cell. The magnetic orientation may be switched between a parallel configuration and an anti-parallel configuration by the application of a current or applied field.

As used herein, "switching" means and includes a stage of use and operation of the memory cell during which programming current is passed through the magnetic cell core of the STT-MRAM cell to effect a parallel or anti-parallel configuration of the magnetic orientations of the free region and the fixed region.

As used herein, "storage" means and includes a stage of use and operation of the memory cell during which programming current is not passed through the magnetic cell core of the STT-MRAM cell and in which the parallel or anti-parallel configuration of the magnetic orientations of the free region and the fixed region is not purposefully altered.

As used herein, the term "vertical" means and includes a direction that is perpendicular to the width and length of the respective region. "Vertical" may also mean and include a direction that is perpendicular to a primary surface of the substrate on which the STT-MRAM cell is located.

As used herein, the term "horizontal" means and includes a direction that is parallel to at least one of the width and length of the respective region. "Horizontal" may also mean and include a direction that is parallel to a primary surface of the substrate on which the STT-MRAM cell is located.

As used herein, the term "sub-region," means and includes a region included in another region. Thus, one magnetic region may include one or more magnetic sub-regions, i.e., sub-regions of magnetic material, as well as non-magnetic sub-regions, i.e., sub-regions of non-magnetic material.

As used herein, the term "base," when referring to a region or material, means and includes the lowest-most region or material of an identified plurality of such regions or materials. For example, the "base magnetic region" refers to the lowest magnetic region compared to other identified magnetic regions.

As used herein, the term "between" is a spatially relative term used to describe the relative disposition of one material, region, or sub-region relative to at least two other materials, regions, or sub-regions. The term "between" can encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate to" is a spatially relative term used to describe disposition of one material, region, or sub-region near to another material, region, or sub-region. The term "proximate" includes dispositions of indirectly adjacent to, directly adjacent to, and internal to.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, other spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular component, structure, device, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD"), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

A memory cell is disclosed. The memory cell includes a magnetic cell core that includes an attracter material proximate to a magnetic region (e.g., the free region). The free region is located between two oxide regions (e.g., MA-inducing regions), at least one of which may function as a tunnel barrier. The attracter material has a higher chemical affinity for a diffusible species of a magnetic material from which the magnetic region is formed, compared to a chemical affinity between the diffusible species and at least one other species of the magnetic material. Therefore, the attracter material is formulated to attract and remove from the magnetic material the diffusible species. The removal of the diffusible species may enable and improve crystallization of the magnetic region, which crystallization, along with other configurations of the magnetic region, may enable formation of a free region with a high MA strength, a high TMR, a high energy barrier and energy barrier ratio, and a high exchange stiffness.

FIG. 1 illustrates an embodiment of a magnetic cell structure 100 according to the present disclosure. The magnetic cell structure 100 includes a magnetic cell core 101 over a substrate 102. The magnetic cell core 101 may be disposed between an upper electrode 104 above and a lower electrode 105 below. The magnetic cell core 101 includes at least two magnetic regions, for example, a "fixed region" 110 and a "free region" 120 with an intermediate oxide region 130 between. Either or both of the fixed region 110 and the free region 120 may be formed homogeneously or, optionally, may be formed to include more than one sub-region (see FIG. 5, discussed further below). The intermediate oxide region 130 may be configured as a tunnel region and may contact the fixed region 110 along interface 131 and may contact the free region 120 along interface 132.

One or more lower intermediary regions 140 may, optionally, be disposed under the magnetic regions (e.g., the fixed region 110 and the free region 120), and one or more upper intermediary regions 150 may, optionally, be disposed over the magnetic regions of the magnetic cell structure 100. The lower intermediary regions 140 and the upper intermediary regions 150, if included, may be configured to inhibit diffusion of species between the lower electrode 105 and overlying materials and between the upper electrode 104 and underlying materials, respectively, during operation of the memory cell.

The magnetic cell core 101 may include a foundation region 160 over the substrate 102. The foundation region 160 may provide a smooth template upon which overlying materials are formed. In some embodiments, the foundation region 160 may be formed directly on the lower electrode 105. In other embodiments, such as that illustrated in FIG. 1, the foundation region 160 may be formed on the one or more lower intermediary regions 140.

A secondary oxide region 170 is formed proximate to the free region 120, e.g., adjacent to a surface of the free region 120 that is opposite a surface of the free region 120 proximate to the intermediate oxide region 130. Thus, the secondary oxide region 170 may be spaced from the intermediate oxide region 130 by the free region 120.

In some embodiments, such as that illustrated in FIG. 1, the secondary oxide region 170 may be formed over (e.g., directly on) the foundation region 160, such that an upper surface of the foundation region 160 and a lower surface of the secondary oxide region 170 may contact one another. In some embodiments, the foundation region 160 is formulated and configured to enable formation of the secondary oxide region 170 to have a crystal structure that enables formation of the free region 120, over the secondary oxide region 170, with a desired crystal structure (e.g., a bcc (001) crystalline structure).

Figure 1B:
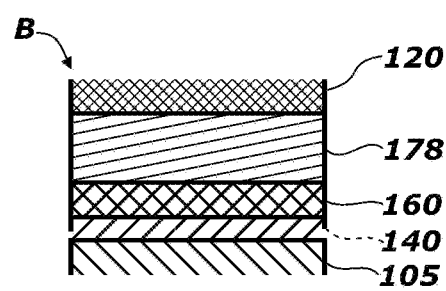
FIG. 1B is an enlarged view of box B of FIG. 1, according to an alternative embodiment of the present disclosure, wherein an attracter region and a secondary oxide region are integrated with one another.

The free region 120 is formed proximate to (e.g., over) the secondary oxide region 170, and an attracter region 180 may be formed proximate to the free region 120. In some embodiments, the attracter region 180 may be between the secondary oxide region 170 and the free region 120. The attracter region 180 may be thin (e.g., less than about 6 Å (less than about 0.6 nm) in height, e.g., less than about 4 Å (less than about 0.4 nm) in height, e.g., about 3 Å (about 0.3 nm) in height). In some embodiments, the attracter region 180 may be discontinuous (i.e., may have gaps between material of the region). In other embodiments, the attracter region 180 may be continuous (i.e., without gaps in the material of the region). In some embodiments, the attracter region 180 and the secondary oxide region 170 may be integrated with one another as an attracter oxide region 178, as illustrated in FIG. 1B. Accordingly, a surface of the free region 120 may not interface solely with the secondary oxide region 170. Rather, the surface of the free region 120 may neighbor the secondary oxide region 170 with the attracter region 180 in proximity therewith.

In other embodiments, which are not illustrated, the attracter region 180 may be formed proximate to the free region 120 without being disposed between the free region 120 and the secondary oxide region 170. For example, the attracter region 180 may be formed to laterally surround, at least in part, the free region 120.

The attracter region 180 may be physically isolated from the fixed region 110 by one or more regions, e.g., by the free region 120 and the intermediate oxide region 130. Therefore, components of the attracter region 180 may not chemically react with the fixed region 110.

In some embodiments, the memory cells of embodiments of the present disclosure may be configured as either in-plane STT-MRAM cells or out-of-plane STT-MRAM cells. "In-plane" STT-MRAM cells include magnetic regions exhibiting a magnetic origination that is predominantly oriented in a horizontal direction, while "out-of-plane" STT-MRAM cells include magnetic regions exhibiting a magnetic orientation that is predominantly oriented in a vertical direction. For example, as illustrated in FIG. 1, the STT-MRAM cell may be configured to exhibit a vertical magnetic orientation in at least one of the magnetic regions (e.g., the fixed region 110 and the free region 120). The vertical magnetic orientation exhibited may be characterized by perpendicular magnetic anisotropy ("PMA") strength. As illustrated in FIG. 1 by arrows 112 and double-pointed arrows 122, in some embodiments, each of the fixed region 110 and the free region 120 may exhibit a vertical magnetic orientation. The magnetic orientation of the fixed region 110 may remain directed in essentially the same direction throughout operation of the STT-MRAM cell, for example, in the direction indicated by arrows 112 of FIG. 1. The magnetic orientation of the free region 120, on the other hand, may be switched, during operation of the cell, between a parallel configuration and an anti-parallel configuration, as indicated by double-pointed arrows 122 of FIG. 1.

Figure 1C:
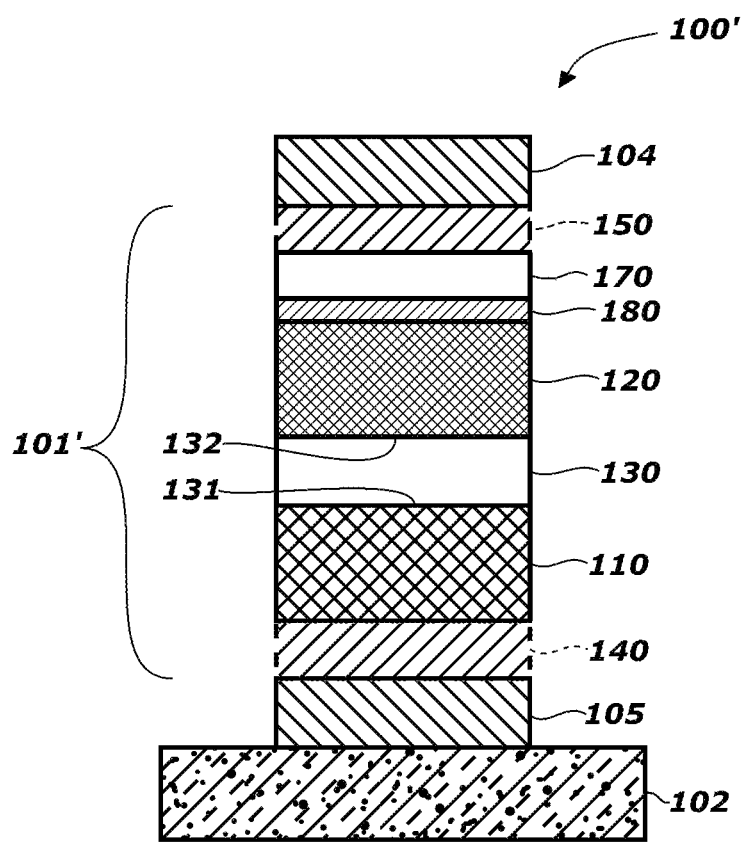
FIG. 1C is a cross-sectional, elevational, schematic illustration of a magnetic cell structure according to an embodiment of the present disclosure, wherein an attracter region is proximate to a secondary oxide region and a free region of the structure, the secondary oxide region overlying the free region and the attracter region.

Though in some embodiments, such as that of FIG. 1, the secondary oxide region 170 may underlay the free region 120, in other embodiments, such as that of FIG. 1C, the secondary oxide region 170 may overlay the free region 120. For example, and without limitation, in FIG. 1C, illustrated is a magnetic cell structure 100' having a magnetic cell core 101' in which the fixed region 110 overlays the lower electrode 105 and, if present, the lower intermediary regions 140. The foundation region 160 (not illustrated in FIG. 1C) may, optionally, be included between, e.g., the lower electrode 105 (or the lower intermediary regions 140, if present) and the fixed region 110. The magnetic cell core 101' also includes the intermediate oxide region 130 over the fixed region 110, the free region 120 over the intermediate oxide region 130, and the secondary oxide region 170 over the free region 120, with the attracter region 180 between the secondary oxide region 170 and the free region 120. In some such embodiments, the attracter region 180 may be incorporated with the secondary oxide region 170, e.g., either as a sub-region of the secondary oxide region 170 or as an attracter oxide region 178 (FIG. 1B). The upper electrode 104 and, if present, the upper intermediary regions 150 may overlay the secondary oxide region 170. Accordingly, in any of the embodiments described herein, the dispositions of the fixed region 110, the intermediate oxide region 130, the free region 120, and the secondary oxide region 170 may be respectively turned, which turning would nonetheless dispose the free region 120 between the intermediate oxide region 130 and the secondary oxide region 170, and the attracter region 180 would nonetheless be proximate to the free region 120.

Figure 2:
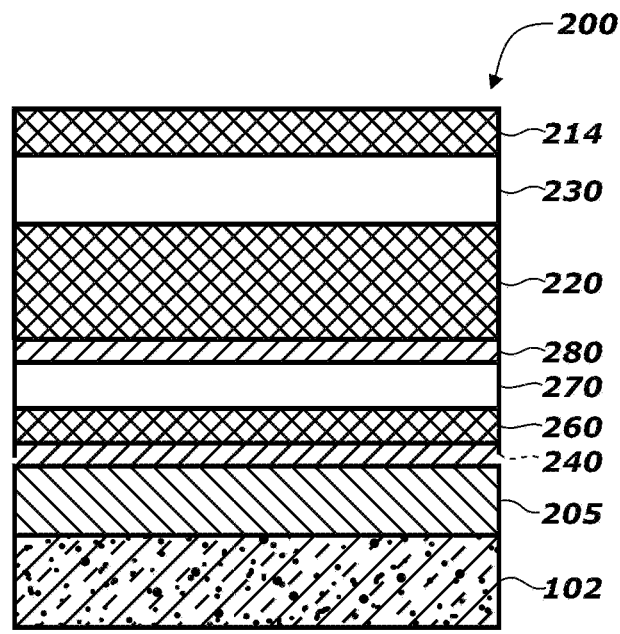
FIGS. 2 through 5 are cross-sectional, elevational, schematic illustrations of a magnetic cell structure during various stages of processing, according to an embodiment of the present disclosure, wherein an attracter material is formed proximate to an oxide material and a magnetic material.

With reference to FIGS. 2 through 5, illustrated are stages in a method of fabricating magnetic cell structures, such as the magnetic cell structure 100 of FIG. 1. As illustrated in FIG. 2, a structure 200 may be formed, from bottom to top, with a conductive material 205 formed over the substrate 102, a foundation material 260 over the conductive material 205, an oxide material 270 over the foundation material 260, a magnetic material 220 over the oxide material 270, another oxide material 230 over the magnetic material 220, and another magnetic material 214 over the another oxide material 230. Optionally, a lower intermediary material 240 may be formed over the conductive material 205, before forming the foundation material 260 thereover. An attracter material 280 is formed proximate to the magnetic material 220. For example, according to the embodiment illustrated in FIG. 2, the attracter material 280 may be formed over the oxide material 270, before forming the magnetic material 220 thereover.

The conductive material 205, from which the lower electrode 105 (FIGS. 1 and 1C) is formed, may comprise, consist essentially of, or consist of, for example and without limitation, a metal (e.g., copper, tungsten, titanium, tantalum), a metal alloy, or a combination thereof.

In embodiments in which the optional lower intermediary region 140 (FIGS. 1 and 1C) is formed over the lower electrode 105, the lower intermediary material 240, from which the lower intermediary region 140 is formed, may comprise, consist essentially of, or consist of, for example and without limitation, tantalum (Ta), titanium (Ti), tantalum nitride (TaN), titanium nitride (TiN), ruthenium (Ru), tungsten (W), or a combination thereof. In some embodiments, the lower intermediary material 240, if included, may be incorporated with the conductive material 205 from which the lower electrode 105 (FIGS. 1 and 1C) is to be formed. For example, the lower intermediary material 240 may be an upper-most sub-region of the conductive material 205.

The foundation material 260 may comprise, consist essentially of, or consist of, for example and without limitation, a material comprising at least one of cobalt (Co) and iron (Fe) (e.g., a CoFeB material), a material comprising a nonmagnetic material (e.g., a nonmagnetic conductive material (e.g., a nickel-based material)), or a combination thereof. The foundation material 260 may be formulated and configured to provide a template that enables forming the oxide material 270 thereover at a desired crystalline structure (e.g., a bcc (001) crystalline structure).

The oxide material 270, from which the secondary oxide region 170 (FIGS. 1 and 1C) is formed, may comprise, consist essentially of, or consist of, for example and without limitation, a nonmagnetic oxide material (e.g., magnesium oxide (MgO), aluminum oxide ($Al_2O_3$), titanium oxide ($TiO_2$), or other oxide materials of conventional MTJ regions). The oxide material 270 may be formed (e.g., grown, deposited) directly on the foundation material 260. In embodiments in which the foundation material 260 is amorphous when initially formed, the resulting oxide material 270 may be crystalline (e.g., have a bcc (001) crystalline structure) when initially formed over the foundation material 260.

The magnetic material 220, from which the free region 120 (FIGS. 1 and 1C) is formed, may comprise, consist essentially of, or consist of, for example and without limitation, ferromagnetic material including cobalt (Co) and iron (Fe) (e.g. $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). Thus, the magnetic material 220 may comprise at least one of Co, Fe, and B (e.g., a CoFeB material). In some embodiments, the magnetic material 220 may comprise the same material as the foundation material 260 or a material having the same elements as the foundation material 260, though with different atomic ratios of those elements. The magnetic material 220 may be formed as a homogeneous region. In other embodiments, the magnetic material 220 may include one or more sub-regions, e.g., of CoFeB material, with the sub-regions having different relative atomic ratios of Co, Fe, and B.

The magnetic material 220 includes at least one diffusible species and at least one other species. The presence of the diffusible species is not necessary for the magnetic material 220 to exhibit magnetism. Moreover, the presence of the diffusible species in the magnetic material 220 may inhibit crystallization of the magnetic material 220. For example, in embodiments in which the magnetic material 220 is a CoFeB material, the boron (B) may be the diffusible species. The presence of boron in the magnetic material 220 may inhibit the magnetic material 220 from being crystallized (e.g., during a subsequent anneal) to a desired crystalline structure (e.g., a bcc (001) crystalline structure).

The attracter material 280, which, in some embodiments, may be a conductive material, may be formulated to have a higher chemical affinity for the diffusible species of the magnetic material 220 than the chemical affinity of the other species of the magnetic material 220 for the diffusible species. For example, and without limitation, in embodiments in which the magnetic material 220 is a CoFeB material, the attracter material 280 may comprise, consist essentially of, or consist of tantalum (Ta), tungsten (W), hafnium (Hf), zirconium (Zr), one or more compounds thereof, or one or more combinations thereof. Such attracter material 280 may have a higher chemical affinity for a boron diffusible species from the CoFeB magnetic material 220 compared to the chemical affinity between boron and the other species of the CoFeB magnetic material 220 (i.e., cobalt and iron).

Figure 3:
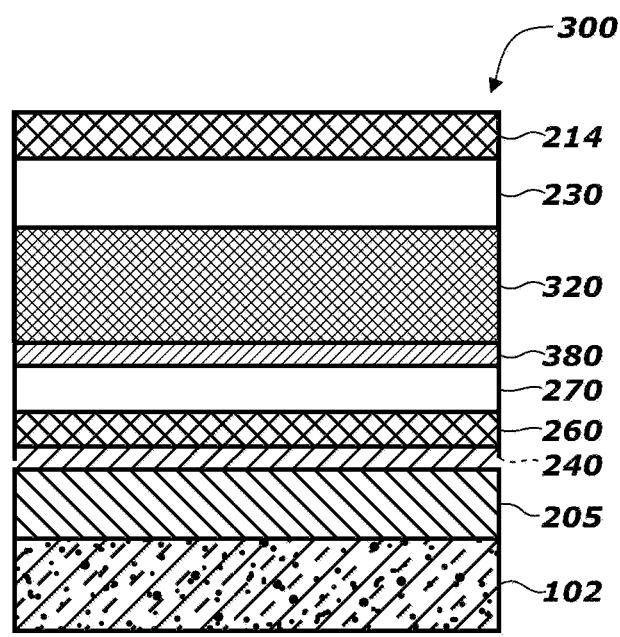

Because the attracter material 280 has a higher chemical affinity for the diffusible species compared to the other species of the magnetic material 220, the proximity of the attracter material 280 to the magnetic material 220 may enable removal of the diffusible species from the magnetic material 220. For example, the diffusible species may diffuse into the attracter material 280 and may chemically bond to the attracter material 280. This removal of the diffusible species from the magnetic material 220 by the attracter material 280 may occur by annealing the structure 200 to form an annealed structure 300, as illustrated in FIG. 3. In the annealed structure 300, the magnetic material 220 (FIG. 2) may, therefore, be converted to a depleted magnetic material 320. As used herein, the term "depleted," when used to describe a material, describes a material from which the diffusible species has been removed. Correspondingly, the attracter material 280 (FIG. 2) may be configured to be an enriched attracter material 380. As used herein, the term "enriched material," when used to describe a material, describes a material to which the diffusible species has been added (e.g., transferred). Therefore, a region of the enriched attracter material 380 comprises the attracter material 280 (FIG. 2) and the diffused species.

For example, and without limitation, in embodiments in which the magnetic material 220 (FIG. 2) is a CoFeB material, the depleted magnetic material 320 may be a CoFe material (i.e., a magnetic material comprising cobalt and iron). In such embodiments in which the attracter material 280 (FIG. 2) is tantalum, the enriched attracter material 380 may be a mixture of tantalum and boron. Without being restricted to any one theory, it is contemplated that removing the diffusible species of boron from the CoFeB magnetic material 220 may enable crystallization of the depleted magnetic material 320 at a lower anneal temperature than the crystallization temperature of the magnetic material 220 (FIG. 2). The depleted magnetic material 320 may, therefore, be crystallized into a desired crystalline structure (e.g., a bcc (001) crystalline structure) that enables formation of the free region 120 (FIG. 1 and FIG. 1C) to a desired thickness without suffering from substantial structure defects, to have a high TMR, and to have a high energy barrier and energy barrier ratio. Achieving these properties with a continuous magnetic region disposed between two oxide regions also enables the free region 120 to have a high exchange stiffness and high MA strength.

While the free region 120 (FIGS. 1 and 1C) is formed from the magnetic material 220 (e.g., a CoFeB material) that comprises the diffusible species, the free region 120 of the fabricated, magnetic cell core 101 (FIG. 1) (or the magnetic cell core 101' (FIG. 1C)) may comprise substantially less of the diffusible species (e.g., the boron (B)). Rather, the attracter region 180 (FIGS. 1 and 1C) of the fabricated, magnetic cell core 101 may comprise both the attracter material 280 and the diffusible species (e.g., the boron (B)) that has diffused from the magnetic material 220. Thus, unless the context indicates otherwise, as used herein, when describing a region "formed from" a material, the "material" means and includes the substance of the region prior to a transformative act (e.g., diffusion) during fabrication.

The attracter material 280 may also be formulated such that an oxide thereof effects an inducement of MA with the free region 120 (FIGS. 1 and 1C). That is, while the diffusible species from the magnetic material 220 (FIG. 2) may react with (e.g., chemically bond to) the attracter material 280, the attracter material 280 may also react with (e.g., chemically bond to) oxygen from the oxide material 270. In embodiments in which the attracter material 280 is formulated such that an oxide thereof induces MA with the free region 120 (FIGS. 1 and 1C), the oxide of the attracter material 280 may enhance the MA induced between the secondary oxide region 170 and the free region 120, rather than degrade the MA inducement.

The another oxide material 230, from which the intermediate oxide region 130 (FIGS. 1 and 1C) is formed, may comprise, consist essentially of, or consist of, for example and without limitation, a nonmagnetic oxide material (e.g., magnesium oxide (MgO), aluminum oxide ($Al_2O_3$), titanium oxide ($TiO_2$), or other oxide materials of conventional MTJ regions). The another oxide material 230 may be the same material as oxide material 270 or a material comprising the same elements as the oxide material 270 though with different atomic ratios thereof. For example, and without limitation, both of the another oxide material 230 and the oxide material 270 may comprise MgO. The another oxide material 230 may be formed (e.g., grown, deposited) directly on the magnetic material 220. The another oxide material 230 may be amorphous when initially formed.

In some embodiments, such as that illustrated in FIGS. 2 and 3, the another magnetic material 214, from which at least a portion of the fixed region 110 (FIGS. 1 and 1C) is formed, may be formed (e.g., grown, deposited) directly on the another oxide material 230. The another magnetic material 214 may comprise, consist essentially of, or consist of, for example and without limitation, ferromagnetic material including cobalt (Co) and iron (Fe) (e.g. $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). Thus, the another magnetic material 214 may comprise a CoFeB material. In some embodiments, the another magnetic material 214 may be the same material as either or both of magnetic material 220 and foundation material 260 or a material having the same elements, though in different atomic ratios.

In annealing the structure 200 of FIG. 2 to form the annealed structure 300 of FIG. 3, at least the magnetic material 220 (FIG. 2) of the free region 120 (FIGS. 1 and 1C) may be crystallized into a desired crystal structure (e.g., a bcc (001) crystalline structure), which crystallization may be promoted by the removal of the diffusible species from the magnetic material 220 (FIG. 2) due to the chemical affinity thereof by the attracter material 280 (FIG. 2). Thus, at least the depleted magnetic material 320 (FIG. 3) may have a desired crystalline structure. Other materials of the annealed structure 300 may also be crystallized due to annealing. During annealing, without being limited to any particular theory, it is contemplated that the crystalline structure of, e.g., the oxide material 270, the another oxide material 230, or both, may propagate to neighboring amorphous materials, such as, e.g., the magnetic material 220 and the another magnetic material 214. Thus, annealing may alter the crystalline structure of one or more materials of the structure 200 (FIG. 2), such as the magnetic material 220. The annealing process may be conducted at an annealing temperature of from about 300° C. to about 600° C. (e.g., about 400° C.) and may be held at the annealing temperature for from about one minute (about 1 min.) to about one hour (about 1 hr.). The annealing temperature and time may be tailored based on the materials of the structure 200, the desired crystal structure of, e.g., the magnetic material 220, and a desired amount of depletion of the diffusible species from the magnetic material 220.

Figure 4:
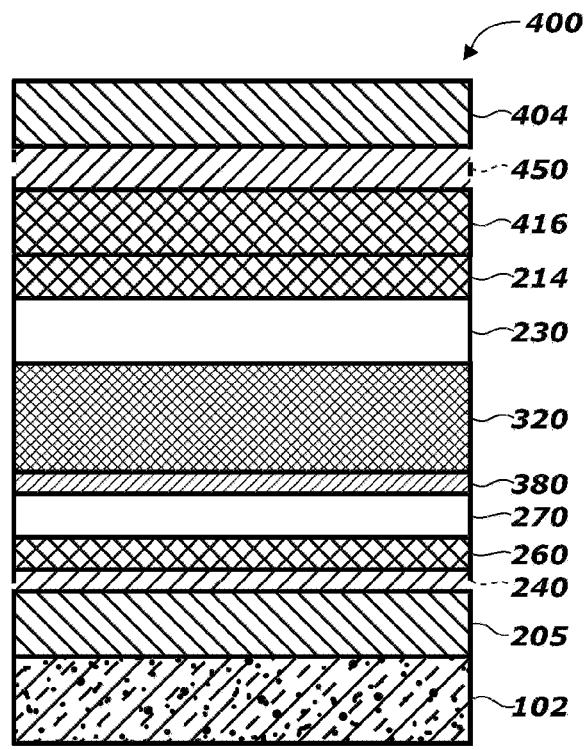

After formation of the structure 200 and, if an anneal is performed, after formation of the annealed structure 300, the remaining materials of the magnetic cell structure may be fabricated to form a precursor structure 400, as illustrated in FIG. 4. For example, another fixed region material 416 may be formed over the another magnetic material 214. The another fixed region material 416 may comprise, consist essentially of, or consist of cobalt/palladium (Co/Pd) multi-sub-regions; cobalt/platinum (Co/Pt) multi-sub-regions; cobalt iron terbium (Co/Fe/Tb) based materials, $L_10$ materials, coupler materials, or other magnetic materials of conventional fixed regions. Thus, the fixed region 110 (FIGS. 1 and 1C) may include the another fixed region material 416 in addition to the another magnetic material 214.

In some embodiments, optionally, one or more upper intermediary materials 450 may be formed over the another fixed region material 416. The upper intermediary materials 450, which, if included, form the optional upper intermediary regions 150 (FIGS. 1 and 1C), may comprise, consist essentially of, or consist of materials configured to ensure a desired crystal structure in neighboring materials. The upper intermediary materials 450 may alternatively or additionally include metal materials configured to aid in patterning processes during fabrication of the magnetic cell, barrier materials, or other materials of conventional STT-MRAM cell core structures. In some embodiments, the upper intermediary material 450 may include a conductive material (e.g., one or more materials such as copper, tantalum, titanium, tungsten, ruthenium, tantalum nitride, or titanium nitride) to be formed into a conductive capping region.

A conductive material 404, from which the upper electrode 104 (FIGS. 1 and 1C) may be formed, may be formed over the another fixed region material 416 and, if present, the upper intermediary materials 450. In some embodiments, the conductive material 404 and the upper intermediary materials 450, if present, may be integrated with one another, e.g., with the upper intermediary materials 450 being lower sub-regions of the conductive material 404.

Figure 5:
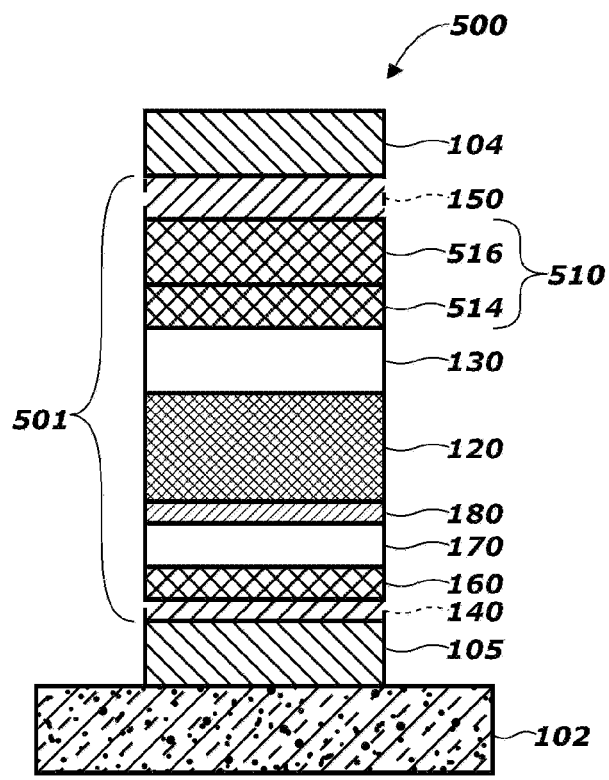

The precursor structure 400 may then be patterned, in one or more stages, to form a magnetic cell structure 500, as illustrated in FIG. 5. Techniques for patterning structures such as the precursor structure 400 (FIG. 4) to form structures such as the magnetic cell structure 500 are known in the art and so are not described herein in detail.

After patterning, the magnetic cell structure 500 includes a magnetic cell core 501 having a fixed region 510 comprising one sub-region (e.g., a lower fixed region 514), formed from the another magnetic material 214 (which may have been annealed and crystallized), and another sub-region (e.g., an upper fixed region 516), formed from the another fixed region material 416 (which may not have been annealed). The magnetic cell core 501 also includes the attracter region 180 proximate to the free region 120. The free region 120, including the depleted magnetic material 320 (FIG. 4) and formed from the magnetic material 220 (FIG. 2), comprises a lower concentration of the diffusible species than a free region formed from the magnetic material 220 (FIG. 2) without the attracter region 180 proximate thereto.

In some embodiments, the free region 120 may be completely depleted of the diffusible species. In other embodiments, the free region 120 may be partially depleted of the diffusible species. In such embodiments, the free region 120 may have a gradient of the diffusible species (e.g., boron) therethrough, with a low concentration of the diffusible species adjacent to the attracter region 180 and a high concentration of the diffusible species opposite the attracter region 180. The concentration of the diffusible species may, in some embodiments, equilibrate after or during anneal.

The free region 120, formed with a crystalline, depleted magnetic material 320 (FIG. 4) may have a desired crystalline structure that may be substantially free of defects, due, at least in part, to the removal of the diffusible species (FIG. 3). The crystallinity of the free region 120 may enable the free region 120 of the magnetic cell structure 500 to be formed to a thickness that effects a high TMR and a high energy barrier and energy barrier ratio (Eb/kT). Moreover, the crystallinity of the free region 120, if consisting of magnetic material (e.g., the depleted magnetic material 320 (FIG. 4)) may also have a high exchange stiffness. Furthermore, in the magnetic cell core 501, the proximity of the free region 120 to two nonmagnetic regions (i.e., the secondary oxide region 170 and the intermediate oxide region 130), which may be formulated to be MA-inducing regions, at the upper and lower surfaces of the free region 120 may induce magnetic anisotropy ("MA") at both surfaces. MA may be induced along the surface of the free region 120 proximate to the secondary oxide region 170, even with the attracter region 180 disposed between the free region 120 and the secondary oxide region 170. The amount of attracter material 280 (FIG. 2) used to form the attracter region 180 may be tailored to be of an amount substantial enough to effect removal of at least some of the diffusible species from the magnetic material 220 (FIG. 2) while also being an amount not so substantial as to inhibit MA inducement between the secondary oxide region 170 and the free region 120.

In one embodiment, the magnetic cell structure 500 includes the foundation region 160 formed from a CoFeB material, the secondary oxide region 170 formed from MgO, the free region 120 formed from a CoFeB material, the attracter region 180 formed from tantalum (Ta), the intermediate oxide region 130 formed from MgO, and at least the lower fixed region 514 formed from a CoFeB material. The attracter region 180 may be enriched with boron, the diffusible species of the CoFeB material of the free region 120, and the free region 120 may be at least partially depleted of boron. Therefore, the free region 120 has a lower concentration of boron compared to the magnetic material from which it was originally formed (i.e., the CoFeB material) and may have a lower concentration of boron compared to that of the lower fixed region 514, the foundation region 160, or both. The free region 120 may have a bcc (001) crystalline structure, a high TMR (e.g., greater than about 0.40 (greater than about 40%), e.g., greater than about 1.0 (greater than about 100%)), a high MA strength (e.g., at least about 1500 Oe (at least about 119 kA/m), e.g., greater than about 2000 Oe (about 160 kA/m), e.g., greater than about 2200 Oe (about 175 kA/m)), and high exchange stiffness.

In other embodiments, the secondary oxide region 170, the free region 120, the intermediate oxide region 130, and the fixed region 110 may be disposed in a different relation to the substrate 102. For example, they, along with the attracter region 180, may be inverted as in the magnetic cell structure 100' of FIG. 1C. A method to form the magnetic cell structure 100' of FIG. 1C, may, therefore, include forming a precursor structure including, from bottom to top, the conductive material 205 (FIG. 2) over the substrate 102, the another magnetic material 214 (FIG. 2) over the conductive material 205, the another oxide material 230 (FIG. 2) over the another magnetic material 214, the magnetic material 220 (FIG. 2) over the another oxide material 230, the attracter material 280 (FIG. 2) over the magnetic material 220, and the oxide material 270 (FIG. 2) over the attracter material 280. In some embodiments, forming the another magnetic material 214 may be preceded or followed by forming the another fixed region material 416 (FIG. 4). Optionally, the upper intermediary materials 450 (FIG. 4) may be formed over the oxide material 270. The conductive material 404 (FIG. 4) may be formed over the other materials. The precursor structure may be annealed before or after patterning to form the magnetic cell core 101' (FIG. 1C). The annealing may promote transfer of the diffusible species from the magnetic material 220 (FIG. 2) to the attracter material 280 (FIG. 2), thus forming the depleted magnetic material 320 (FIG. 3) and the enriched attracter material 380 (FIG. 3). In such an embodiment, the diffusible species transfers upwards, and the enriched attracter material 380 overlays the depleted magnetic material 320.

Accordingly, disclosed is a memory cell comprising a magnetic cell core. The magnetic cell core comprises a magnetic region exhibiting a switchable magnetic orientation and formed from a magnetic material comprising a diffusible species and at least one other species. The magnetic cell core also comprises another magnetic region exhibiting a fixed magnetic orientation. An intermediate oxide region is between the magnetic region and the another magnetic region. Another oxide region is spaced from the intermediate oxide region by the magnetic region. An attracter material is proximate to the magnetic region. A chemical affinity of the attracter material for the diffusible species is higher than a chemical affinity of the at least one other species for the diffusible species.

Figure 6:
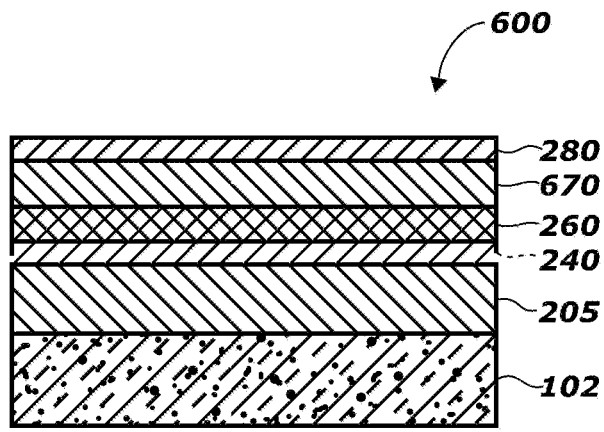
FIGS. 6 through 12 are cross-sectional, elevational, schematic illustrations of a magnetic cell structure during various stages of processing, according to an embodiment of the present disclosure, wherein an attracter oxide region is formed proximate a magnetic material.

With reference to FIGS. 6 through 12, illustrated are stages in an alternative method of forming a magnetic cell according to an embodiment of the present disclosure. As illustrated in FIG. 6, a structure 600 may be formed to include, over the substrate 102 and from bottom to top, the conductive material 205, optionally the lower intermediary material 240, the foundation material 260, a base precursor material 670, and the attracter material 280. The base precursor material 670 may be a not-yet-oxidized material. For example, the base precursor material 670 may comprise, consist essentially of, or consist of magnesium (Mg), aluminum (Al), titanium (Ti), or another metal that, once oxidized, may be formulated to induce MA with the free region 120 (FIG. 1).

Figure 7:
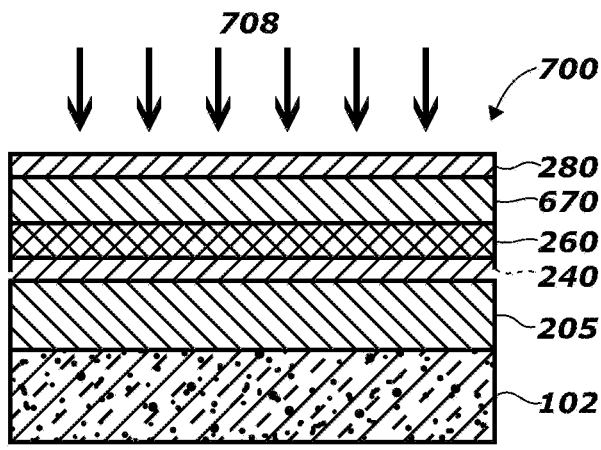
Figure 8:
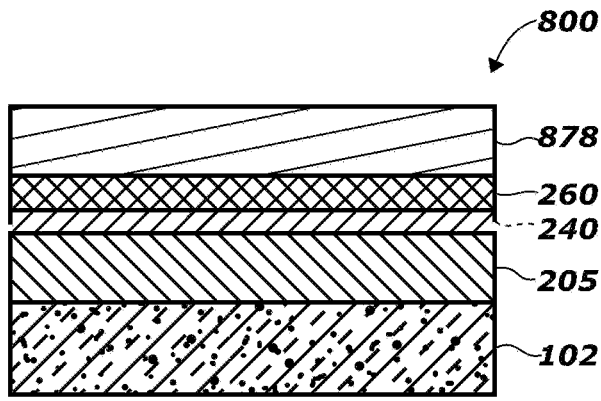

The structure 600 may be exposed to an oxidizing environment to form structure 700 of FIG. 7, wherein arrows 708 indicate exposure to the oxidizing environment. Following the oxidation, the base precursor material 670 and the attracter material 280, in structure 800 of FIG. 8, may be converted into an attracter oxide material 878. Thus, as in FIG. 1B, the secondary oxide region 170 (FIG. 1) and the attracter region 180 (FIG. 1) may be integrated with one another as the attracter oxide region 178 (FIG. 1B) formed from the attracter oxide material 878. Again, the attracter oxide material 878 may be formulated to have a higher chemical affinity for the diffusible species of the magnetic material 220 (FIG. 2) than a chemical affinity between the diffusible species and another species of the magnetic material 220.

Figure 9:
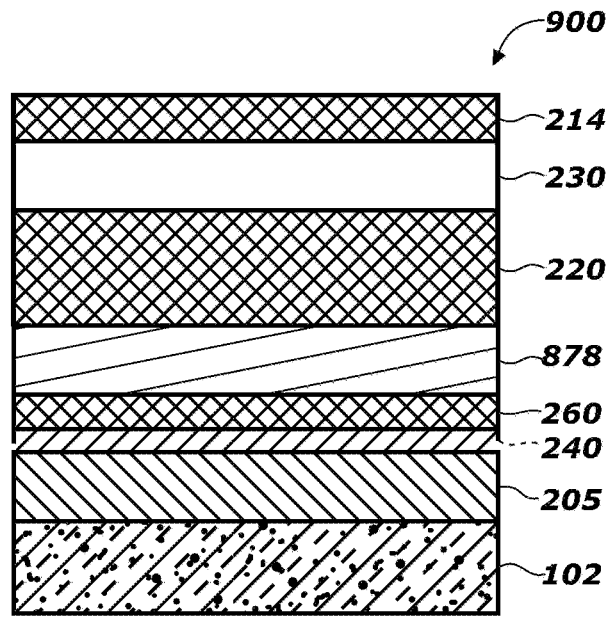

After forming the attracter oxide material 878, the other lower-most materials of a magnetic cell structure to be formed may be formed over the attracter oxide material 878. For example, as illustrated in FIG. 9, the magnetic material 220, the another oxide material 230, and the another magnetic material 214 may be formed, sequentially and from bottom to top, over the attracter oxide material 878 to form structure 900.

Figure 10:
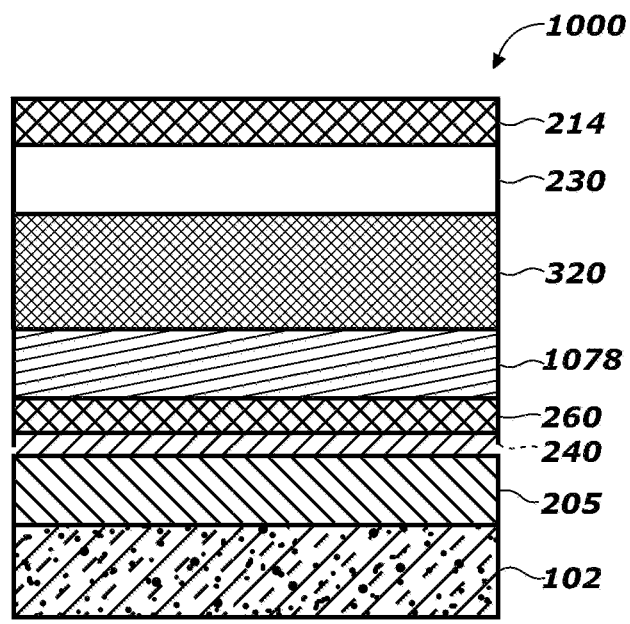

The structure 900 may then be annealed to form annealed structure 1000 of FIG. 10, including the depleted magnetic material 320 and an enriched attracter oxide material 1078. Annealing may promote diffusion of the diffusible species from the magnetic material 220 (FIG. 9) to form the depleted magnetic material 320 and the enriched attracter oxide material 1078. The removal of the diffusible species from the magnetic material 220 (FIG. 9) may enable crystallization of the magnetic material 220 to form the depleted magnetic material 320 at a desired crystalline structure (e.g., a bcc (001) crystalline structure).

Figure 11:
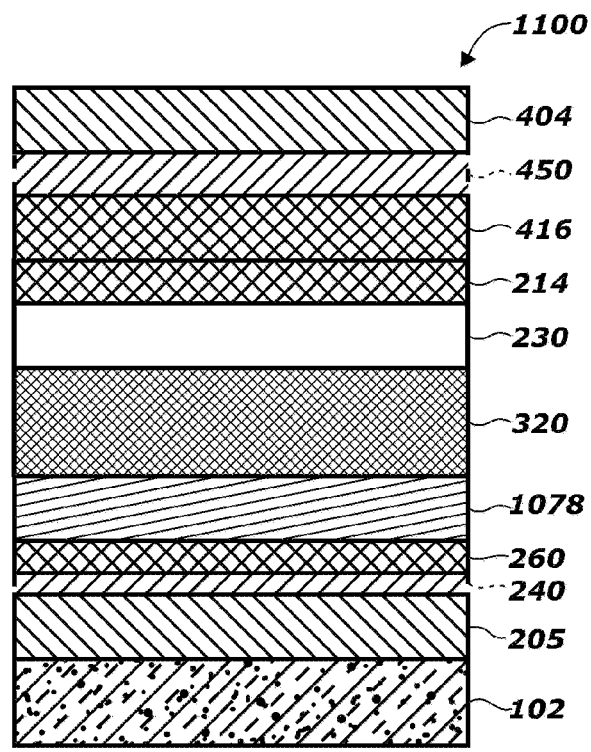
Figure 12:
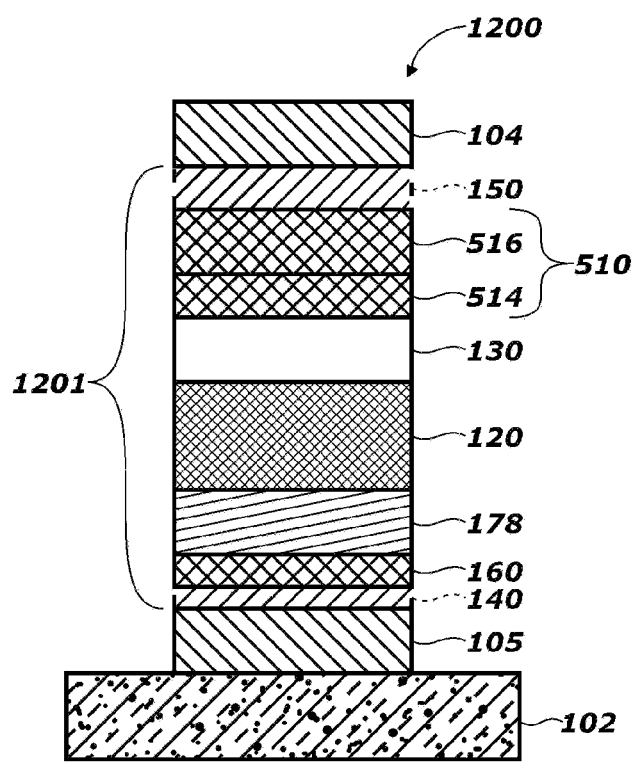

The upper-most materials of a precursor structure 1100, as illustrated in FIG. 11, may then be formed over the another magnetic material 214. Such materials may include, for example, the another fixed region material 416, optionally the upper intermediary material 450, and the another conductive material 404. The precursor structure 1100 may then be patterned to form a magnetic cell structure 1200, as illustrated in FIG. 12. The magnetic cell structure 1200 includes a magnetic cell core 1201 that includes the attracter oxide region 178 comprising the enriched attracter oxide material 1078 (FIG. 11), formed from the attracter oxide material 878 (FIG. 9). The magnetic cell structure 1200 may, therefore, have a high TMR, a high energy barrier and energy barrier ratio, high exchange stiffness in the free region 120, and high MA strength.

Accordingly, disclosed is a method of forming a magnetic memory cell, the method comprising forming a precursor structure. Forming the precursor structure comprises forming a magnetic material between an oxide material and another oxide material. The magnetic material exhibits a switchable magnetic orientation. An attracter material is formed proximate to the magnetic material. The attracter material has a chemical affinity for a diffusible species of the magnetic material. The diffusible species is transferred from the magnetic material to the attracter material. A magnetic cell core structure is formed from the precursor structure.

Figure 13:
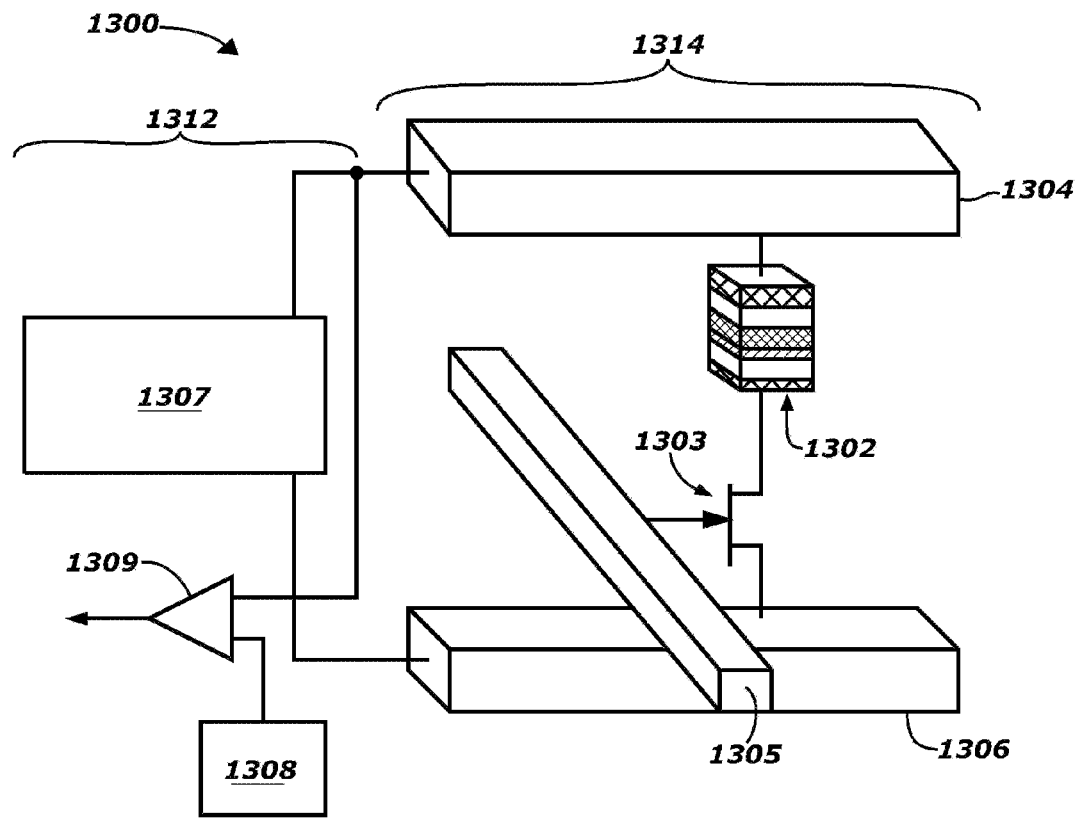
FIG. 13 is a schematic diagram of an STT-MRAM system including a memory cell having a magnetic cell structure according to an embodiment of the present disclosure.

With reference to FIG. 13, illustrated is an STT-MRAM system 1300 that includes peripheral devices 1312 in operable communication with an STT-MRAM cell 1314, a grouping of which may be fabricated to form an array of memory cells in a grid pattern including a number of rows and columns, or in various other arrangements, depending on the system requirements and fabrication technology. The STT-MRAM cell 1314 includes a magnetic cell core 1302, an access transistor 1303, a conductive material that may function as a data/sense line 1304 (e.g., a bit line), a conductive material that may function as an access line 1305 (e.g., a word line), and a conductive material that may function as a source line 1306. The peripheral devices 1312 of the STT-MRAM system 1300 may include read/write circuitry 1307, a bit line reference 1308, and a sense amplifier 1309. The cell core 1302 may be any one of the magnetic cell cores (e.g., the magnetic cell core 101 (FIG. 1), the magnetic cell core 101' (FIG. 1C), the magnetic cell core 501 (FIG. 5), the magnetic cell core 1201 (FIG. 12)) described above. Due to the structure of the cell core 1302, the method of fabrication, or both, the STT-MRAM cell 1314 may have a high TMR, a high energy barrier and energy barrier ratio (Eb/kT), a free region with high exchange stiffness, and a high MA strength.

In use and operation, when an STT-MRAM cell 1314 is selected to be programmed, a programming current is applied to the STT-MRAM cell 1314, and the current is spin-polarized by the fixed region of the cell core 1302 and exerts a torque on the free region of the cell core 1302, which switches the magnetization of the free region to "write to" or "program" the STT-MRAM cell 1314. In a read operation of the STT-MRAM cell 1314, a current is used to detect the resistance state of the cell core 1302.

To initiate programming of the STT-MRAM cell 1314, the read/write circuitry 1307 may generate a write current (i.e., a programming current) to the data/sense line 1304 and the source line 1306. The polarity of the voltage between the data/sense line 1304 and the source line 1306 determines the switch in magnetic orientation of the free region in the cell core 1302. By changing the magnetic orientation of the free region with the spin polarity, the free region is magnetized according to the spin polarity of the programming current, and the programmed logic state is written to the STT-MRAM cell 1314.

To read the STT-MRAM cell 1314, the read/write circuitry 1307 generates a read voltage to the data/sense line 1304 and the source line 1306 through the cell core 1302 and the access transistor 1303. The programmed state of the STT-MRAM cell 1314 relates to the electrical resistance across the cell core 1302, which may be determined by the voltage difference between the data/sense line 1304 and the source line 1306. In some embodiments, the voltage difference may be compared to the bit line reference 1308 and amplified by the sense amplifier 1309.

FIG. 13 illustrates one example of an operable STT-MRAM system 1300. It is contemplated, however, that the magnetic cell cores (e.g., the magnetic cell core 101 (FIG. 1), the magnetic cell core 101' (FIG. 1C), the magnetic cell core 501 (FIG. 5), the magnetic cell core 1201 (FIG. 12)) may be incorporated and utilized within any STT-MRAM system configured to incorporate a magnetic cell core having magnetic regions.

Accordingly, disclosed is a semiconductor device comprising a spin torque transfer magnetic random access memory (STT-MRAM) array comprising STT-MRAM cells. At least one STT-MRAM cell of the STT-MRAM cells comprises an oxide region over a substrate and a crystalline magnetic region over the oxide region. The crystalline magnetic region is formed from a magnetic material. An attracter material is proximate to the crystalline magnetic region. A chemical affinity of the attracter material for a diffused species from the magnetic material is higher than a chemical affinity of at least one other species of the magnetic material for the diffused species. An intermediate oxide region is over the crystalline magnetic region, and another magnetic region is over the intermediate oxide region.

Figure 14:
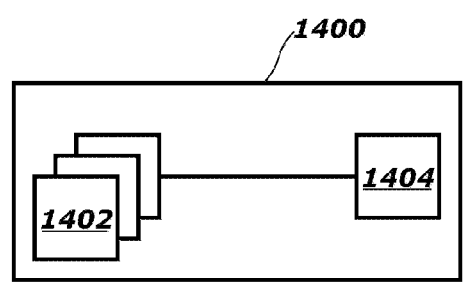
FIG. 14 is a simplified block diagram of a semiconductor device structure including memory cells having a magnetic cell structure according to an embodiment of the present disclosure.

With reference to FIG. 14, illustrated is a simplified block diagram of a semiconductor device 1400 implemented according to one or more embodiments described herein.

The semiconductor device 1400 includes a memory array 1402 and a control logic component 1404. The memory array 1402 may include a plurality of the STT-MRAM cells 1314 (FIG. 13) including any of the magnetic cell cores (e.g., the magnetic cell core 101 (FIG. 1), the magnetic cell core 101' (FIG. 1C), the magnetic cell core 501 (FIG. 5), the magnetic cell core 1201 (FIG. 12)) discussed above, which magnetic cell cores (e.g., the magnetic cell core 101 (FIG. 1), the magnetic cell core 101' (FIG. 1C), the magnetic cell core 501 (FIG. 5), the magnetic cell core 1201 (FIG. 12)) may have been formed according to a method described above and may be operated according to a method described above. The control logic component 1404 may be configured to operatively interact with the memory array 1402 so as to read from or write to any or all memory cells (e.g., STT-MRAM cell 1314 (FIG. 13)) within the memory array 1402.

Accordingly, disclosed is a semiconductor device comprising a spin torque transfer magnetic random access memory (STT-MRAM) array comprising STT-MRAM cells. At least one STT-MRAM cell of the STT-MRAM cells comprises a free region over a substrate. An attracter region is proximate to the free region. The attracter region comprises an attracter material and a species diffused from the free region. The attracter material has a chemical affinity for the species, and an oxide of the species induces magnetic anisotropy in the free region. An intermediate oxide region is over the free region, and a fixed region is over the intermediate oxide region.

Figure 15:
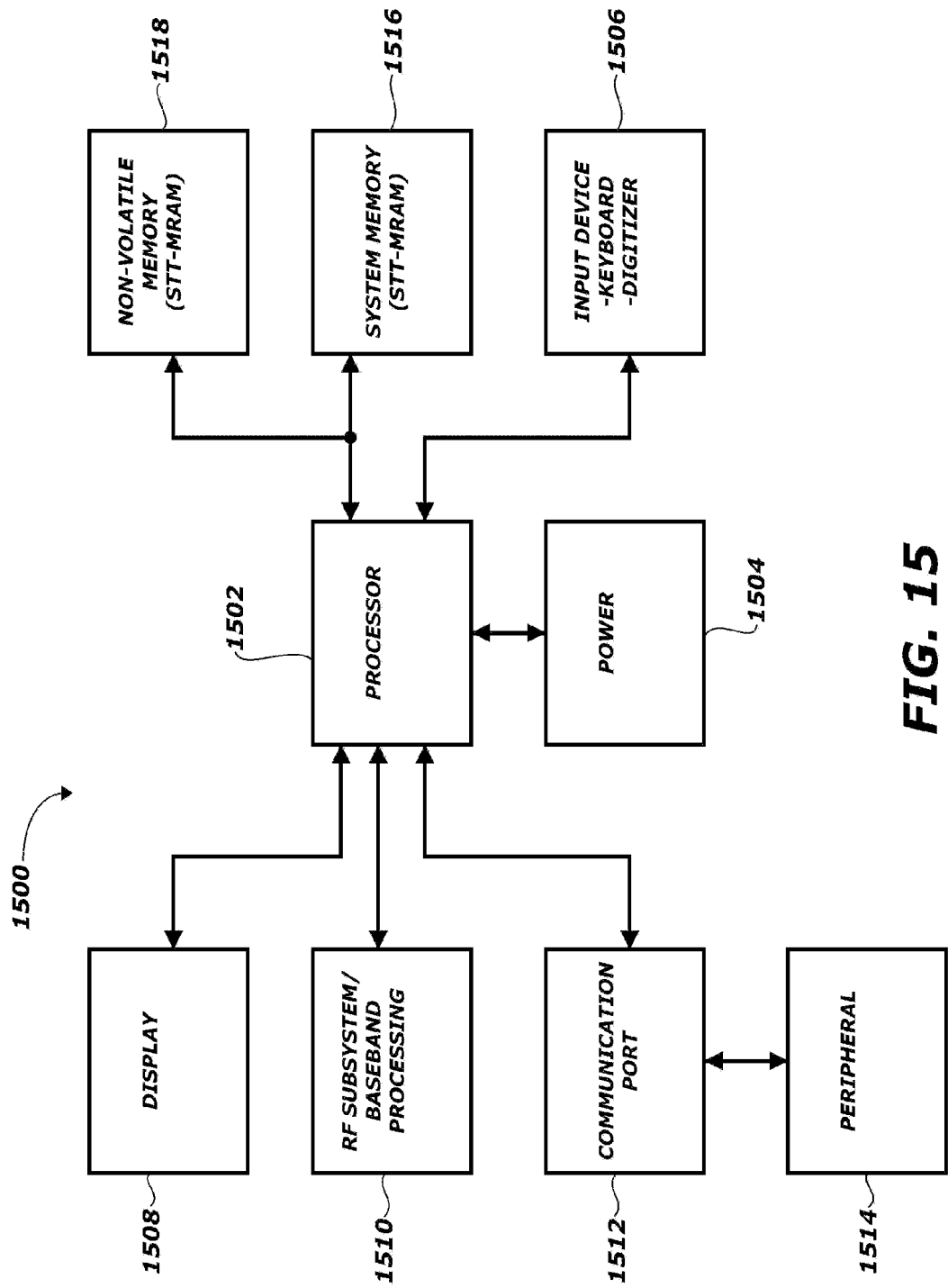
FIG. 15 is a simplified block diagram of a system implemented according to one or more embodiments of the present disclosure.

With reference to FIG. 15, depicted is a processor-based system 1500. The processor-based system 1500 may include various electronic devices manufactured in accordance with embodiments of the present disclosure. The processor-based system 1500 may be any of a variety of types such as a computer, pager, cellular phone, personal organizer, control circuit, or other electronic device. The processor-based system 1500 may include one or more processors 1502, such as a microprocessor, to control the processing of system functions and requests in the processor-based system 1500. The processor 1502 and other subcomponents of the processor-based system 1500 may include magnetic memory devices manufactured in accordance with embodiments of the present disclosure.

The processor-based system 1500 may include a power supply 1504 in operable communication with the processor 1502. For example, if the processor-based system 1500 is a portable system, the power supply 1504 may include one or more of a fuel cell, a power scavenging device, permanent batteries, replaceable batteries, and rechargeable batteries. The power supply 1504 may also include an AC adapter; therefore, the processor-based system 1500 may be plugged into a wall outlet, for example. The power supply 1504 may also include a DC adapter such that the processor-based system 1500 may be plugged into a vehicle cigarette lighter or a vehicle power port, for example.

Various other devices may be coupled to the processor 1502 depending on the functions that the processor-based system 1500 performs. For example, a user interface 1506 may be coupled to the processor 1502. The user interface 1506 may include input devices such as buttons, switches, a keyboard, a light pen, a mouse, a digitizer and stylus, a touch screen, a voice recognition system, a microphone, or a combination thereof. A display 1508 may also be coupled to the processor 1502. The display 1508 may include an LCD display, an SED display, a CRT display, a DLP display, a plasma display, an OLED display, an LED display, a three-dimensional projection, an audio display, or a combination thereof. Furthermore, an RF sub-system/baseband processor 1510 may also be coupled to the processor 1502. The RF sub-system/baseband processor 1510 may include an antenna that is coupled to an RF receiver and to an RF transmitter (not shown). A communication port 1512, or more than one communication port 1512, may also be coupled to the processor 1502. The communication port 1512 may be adapted to be coupled to one or more peripheral devices 1514, such as a modem, a printer, a computer, a scanner, or a camera, or to a network, such as a local area network, remote area network, intranet, or the Internet, for example.

The processor 1502 may control the processor-based system 1500 by implementing software programs stored in the memory. The software programs may include an operating system, database software, drafting software, word processing software, media editing software, or media playing software, for example. The memory is operably coupled to the processor 1502 to store and facilitate execution of various programs. For example, the processor 1502 may be coupled to system memory 1516, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 1516 may include volatile memory, non-volatile memory, or a combination thereof. The system memory 1516 is typically large so that it can store dynamically loaded applications and data. In some embodiments, the system memory 1516 may include semiconductor devices, such as the semiconductor device 1400 of FIG. 14, memory cells including any of the magnetic cell cores (e.g., the magnetic cell core 101 (FIG. 1), the magnetic cell core 101' (FIG. 1C), the magnetic cell core 501 (FIG. 5), the magnetic cell core 1201 (FIG. 12)) described above, or a combination thereof.

The processor 1502 may also be coupled to non-volatile memory 1518, which is not to suggest that system memory 1516 is necessarily volatile. The non-volatile memory 1518 may include one or more of STT-MRAM, MRAM, read-only memory (ROM) such as an EPROM, resistive read-only memory (RROM), and flash memory to be used in conjunction with the system memory 1516. The size of the non-volatile memory 1518 is typically selected to be just large enough to store any necessary operating system, application programs, and fixed data. Additionally, the non-volatile memory 1518 may include a high capacity memory such as disk drive memory, such as a hybrid-drive including resistive memory or other types of non-volatile solid-state memory, for example. The non-volatile memory 1518 may include semiconductor devices, such as the semiconductor device 1400 of FIG. 14, memory cells including any of the magnetic cell cores (e.g., the magnetic cell core 101 (FIG. 1), the magnetic cell core 101' (FIG. 1C), the magnetic cell core 501 (FIG. 5), the magnetic cell core 1201 (FIG. 12)) described above, or a combination thereof.

Accordingly, disclosed is a semiconductor device comprising an array of magnetic memory cells. At least one magnetic memory cell of the array of magnetic memory cells comprises at least two magnetic regions over an oxide region over a substrate. One of the at least two magnetic regions exhibits a switchable magnetic orientation. An attracter material is proximate to the one of the at least two magnetic regions exhibiting the switchable magnetic orientation. The attracter material is chemically bonded to a species diffused from the one of the at least two magnetic regions exhibiting the switchable magnetic orientation. An intermediate oxide region is between the at least two magnetic regions.

EXAMPLE

With reference to FIGS. 16 through 22, magnetic cell core structures, both with and without attracter material, were fabricated and examined to measure and compare characteristics, such as TMR, RA, and Hk (an indication of MA strength).

Figure 16:
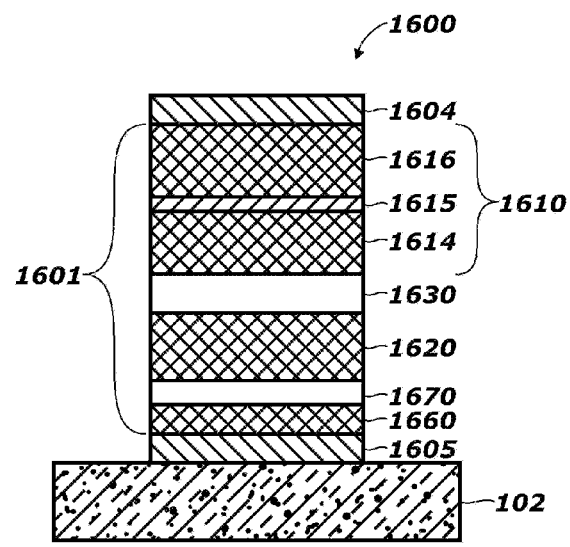
FIG. 16 is a cross-sectional, elevational, schematic illustration of a magnetic cell structure without an attracter region proximate to an oxide material and a magnetic material.
Figure 17A:
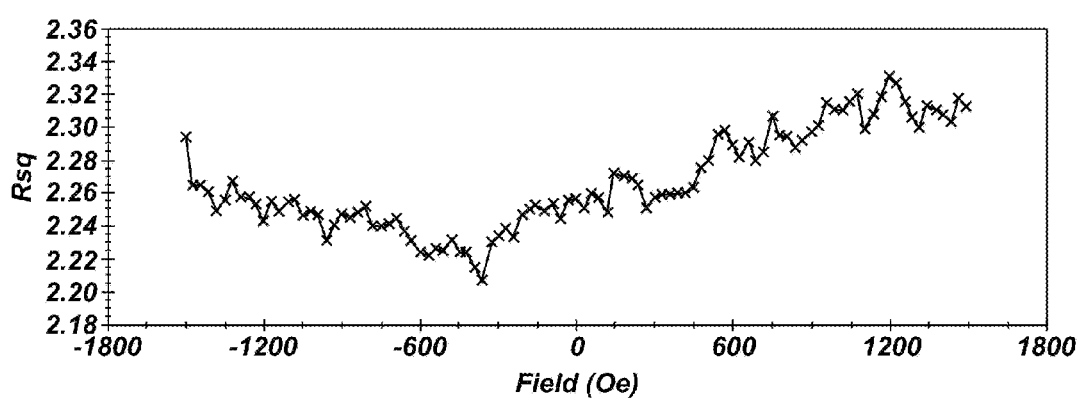
FIG. 17A is an R-H loop plot of the magnetic cell structure of FIG. 16.
Figure 17B:
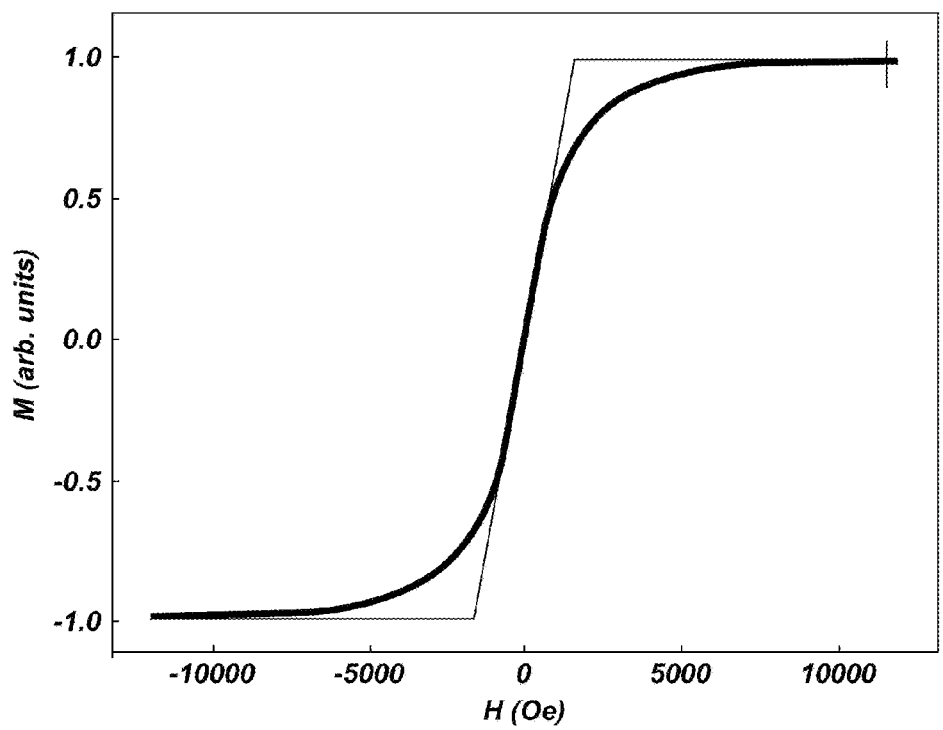
FIG. 17B is an in-plane loop plot of the magnetic cell structure of FIG. 16.
Figure 17C:
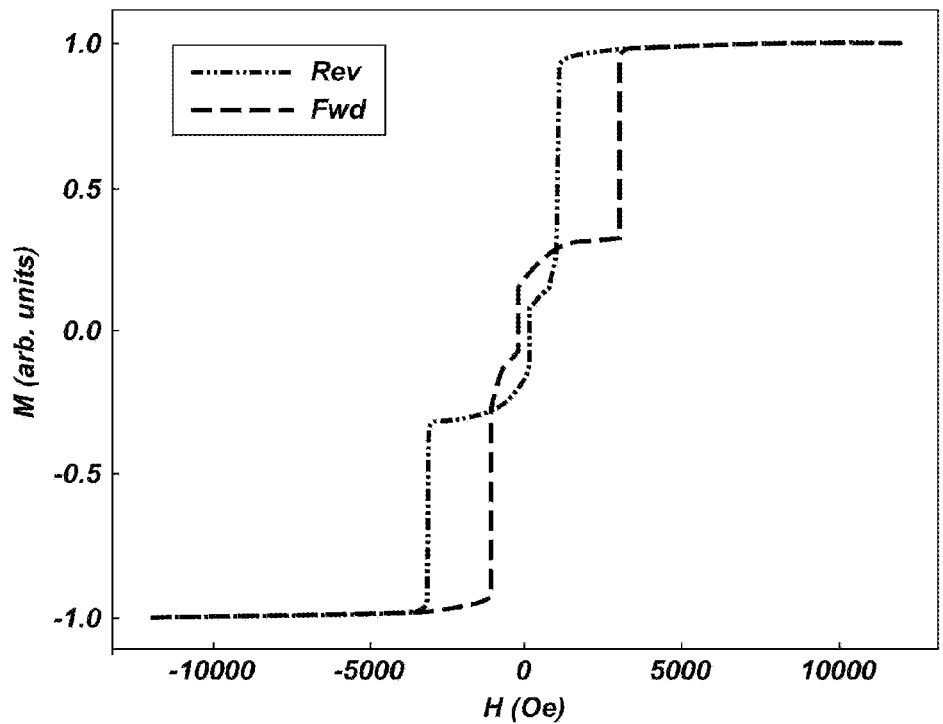
FIG. 17C is an M-H loop plot of the magnetic cell structure of FIG. 16.

With reference to FIG. 16, magnetic cell core structure 1600, having a magnetic cell core 1601 without an attracter material, was tested, the results of which are depicted in FIGS. 17A through 17C. The magnetic cell core structure 1600 included a tantalum (Ta) lower electrode 1605. Thereover, a CoFeB foundation region 1660 was formed to a thickness of 6 Å (0.6 nm). Thereover, a magnesium oxide (MgO) secondary oxide region 1670 was formed to a thickness of about 5 Å (about 0.5 nm). Thereover, a free region 1620 was formed from CoFeB to a thickness of 14 Å (1.4 nm). Thereover, an intermediate oxide region 1630 of MgO was formed to a thickness of about 7 Å (about 0.7 nm) to about 8 Å (about 0.8 nm). Thereover, a fixed region 1610 was formed having a lower fixed region 1614, an intermediate fixed region 1615, and an upper fixed region 1616. The lower fixed region 1614 was formed from CoFeB to a thickness of 13 Å (about 1.3 nm). The intermediate fixed region 1615 was formed of tantalum (Ta) to a thickness of about 3 Å (about 0.3 nm). The upper fixed region 1616 was formed of alternating sub-regions of cobalt (Co) and palladium (Pd). Thereover, at least a portion of an upper electrode 1604 was formed of at least one of tantalum (Ta), tungsten (W), and ruthenium (Ru).

With reference to FIG. 17A, an R-H loop evaluation of the magnetic cell structure 1600 (FIG. 16) was made to measure TMR and RA. These evaluations and measurements were made by conventional techniques (e.g., a current-in-plane technique (CIPT)), which are not described in detail herein. In an R-H loop plot, a sharp transition at low fields (e.g., around 0% field) suggests a free region reversal (i.e., a switch in the magnetic configuration between anti-parallel and parallel, or vice versa, of a free region). No sharp transition in an R-H loop indicates no free region reversal (i.e., no switch in magnetic configuration between anti-parallel and parallel, or vice versa, of a free region). Notably, in FIG. 17A, no substantial transition is indicated for the magnetic cell structure 1600 (FIG. 16), lacking the attracter material. The TMR of the magnetic cell structure 1600 was found to be about 0.01 (i.e., about 1%). The resistance area product (RA) of the magnetic cell structure 1600, an indication of the electrical resistance of the magnetic cell structure 1600, was found to be about 12 $\Omega \cdot \mu m^2$. In FIG. 17B, an in-plane loop evaluation was conducted of the magnetic cell structure 1600, using conventional methods that are not described in detail herein. The in-plane loop evaluation indicates an Hk value (an indication of MA strength) of 1,607 Oe (127.9 kA/m). With reference to FIG. 17C, the TMR measurement was confirmed with an M-H loop evaluation, which was conducted using conventional methods that are not described in detail herein. The M-H loop evaluation indicated a TMR of less than 5%. Accordingly, the magnetic cell structure 1600, lacking the attracter material proximate to the free region 1620 was measured to have a weak TMR (e.g., less than 5%), an RA of about 12 $\Omega \cdot \mu m^2$, and an Hk value (an indication of MA strength) of about 1,600 Oe (e.g., 1607 Oe (127.9 kA/m)).

Figure 18:
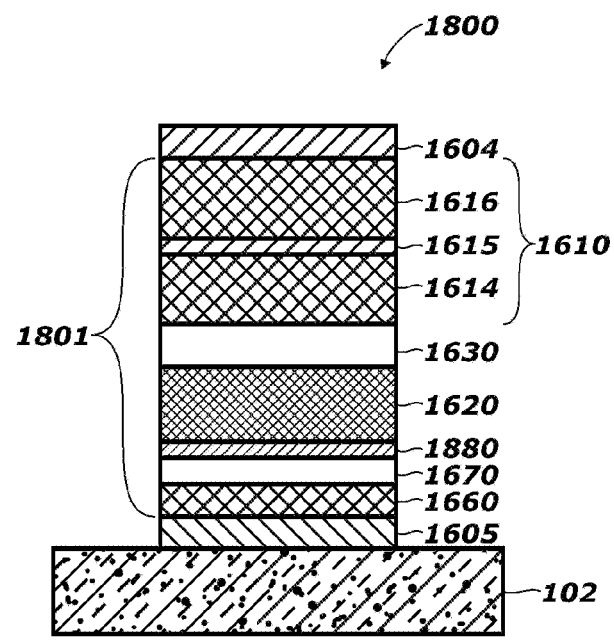
FIG. 18 is a cross-sectional, elevational, schematic illustration of a magnetic cell structure, wherein an attracter region is proximate to an oxide material and a magnetic material.

With reference to FIG. 18, a magnetic cell core structure 1800, having a structure according to an embodiment of the present disclosure and formed according to an embodiment of the present disclosure, was formed to have the same structure as that of the magnetic cell core structure 1600 (FIG. 16) with the exception of an attracter region 1880 of tantalum (Ta), formed to a thickness of 3 Å (0.3 nm), between the secondary oxide region 1670 and the free region 1620.

Figure 19A:
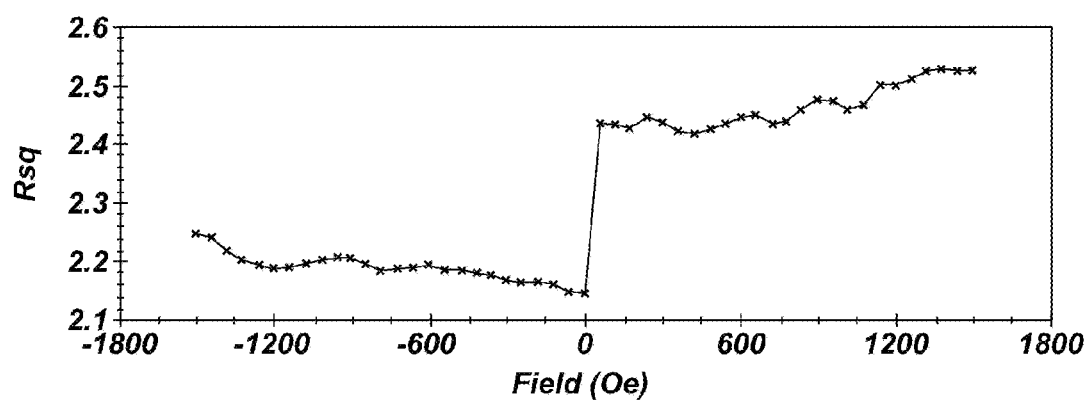
FIG. 19A is an R-H loop plot of the magnetic cell structure of FIG. 18.
Figure 19B:
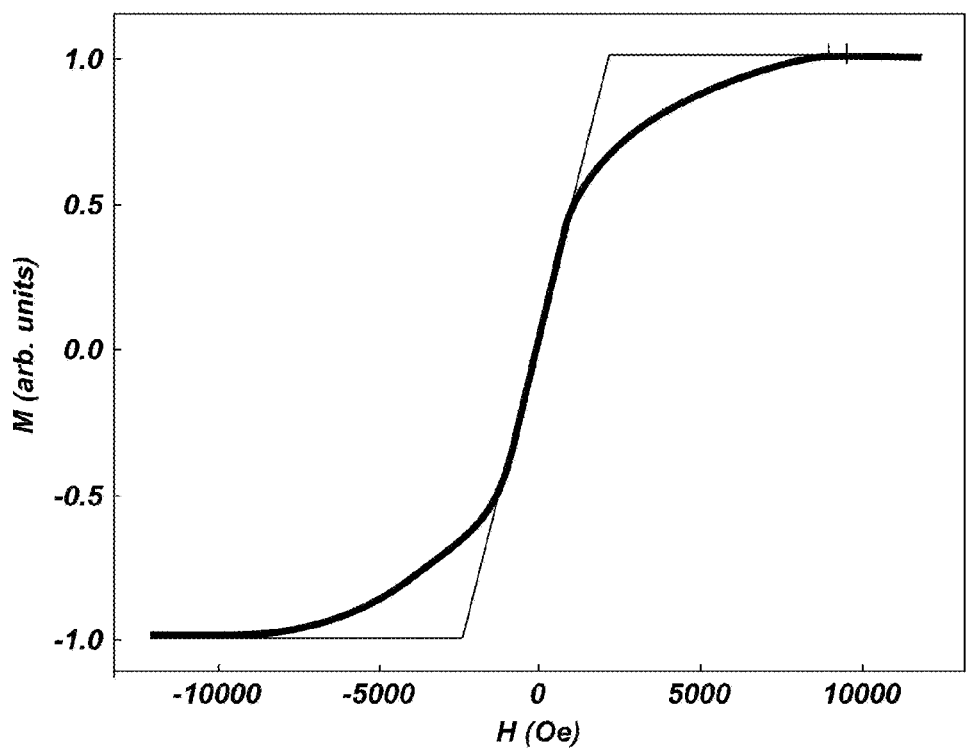
FIG. 19B is an in-plane loop plot of the magnetic cell structure of FIG. 18.
Figure 19C:
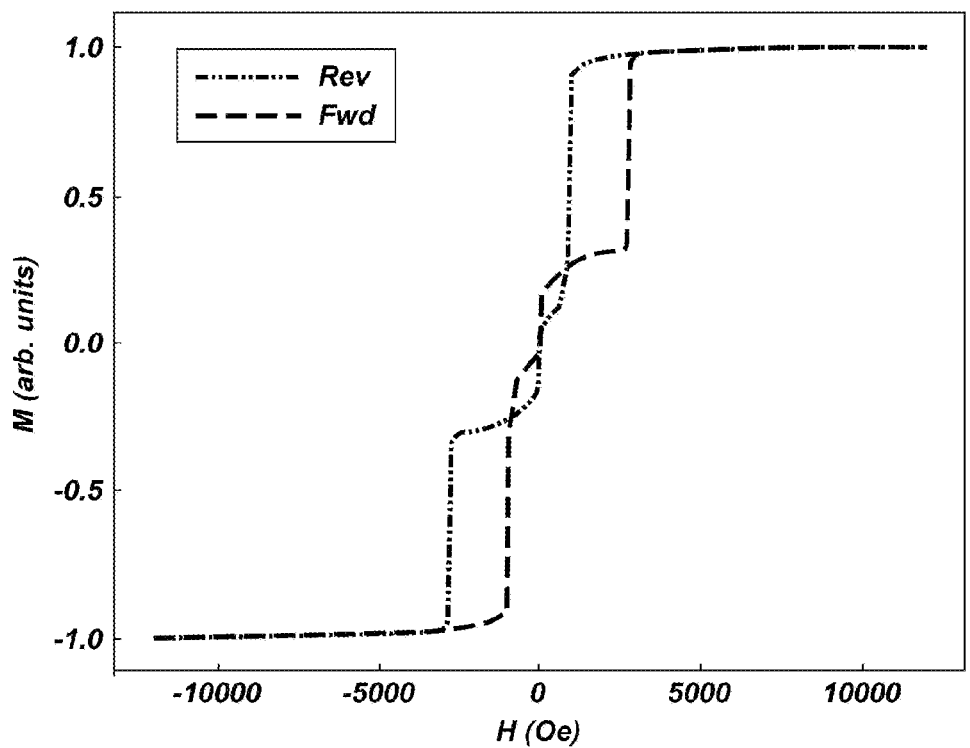
FIG. 19C is an M-H loop plot of the magnetic cell structure of FIG. 18.

With reference to FIG. 19A, an R-H loop evaluation of the magnetic cell structure 1800 (FIG. 18) was made. The TMR of the magnetic cell structure 1800 was found to be about 42%, substantially greater than the less than 5% TMR measured for the magnetic cell structure 1600 (FIG. 16) lacking the attracter region 1880. The RA of the magnetic cell structure 1800, with the attracter region 1880, was measured to be about 15 $\Omega \cdot \mu m^2$. With reference to FIG. 19B, an in-plane loop evaluation of the magnetic cell structure 1800 indicated an Hk of 2,276 Oe (181.1 kA/m). Thus, the MA strength of the magnetic cell structure 1800, with the attracter region 1880, was found to be higher than the MA strength of the magnetic cell structure 1600 (FIG. 16), without the attracter region 1880, even though the attracter region 1880 was between the free region 1620 and the secondary oxide region 1670. With reference to FIG. 19C, an M-H loop evaluation of the magnetic cell structure 1800 confirmed the TMR measurement of about 42%. Thus, the magnetic cell structure 1800, with the attracter region 1880 proximate to the free region 1620, was measured to have a stronger TMR than the magnetic cell structure 1600 (FIG. 16) without the attracter region 1880 (i.e., 42% compared to less than 5%), along with an RA of about 15 $\Omega \cdot \mu m^2$ (compared to the RA of about 12 $\Omega \cdot \mu m^2$ for the magnetic cell structure 1600) and an Hk of about 2,276 Oe (181.1 kA/m) (compared to 1,607 Oe (127.9 kA/m) for the magnetic cell structure 1600).

Accordingly, including the attracter region 1880 increased the TMR of the magnetic cell structure 1800 substantially. Additionally, the MA strength was found to substantially increase. Therefore, the inclusion of the attracter region 1880 proximate to the free region 1620 enables higher TMR and high MA strength in the magnetic cell structure 1800.

Figure 20:
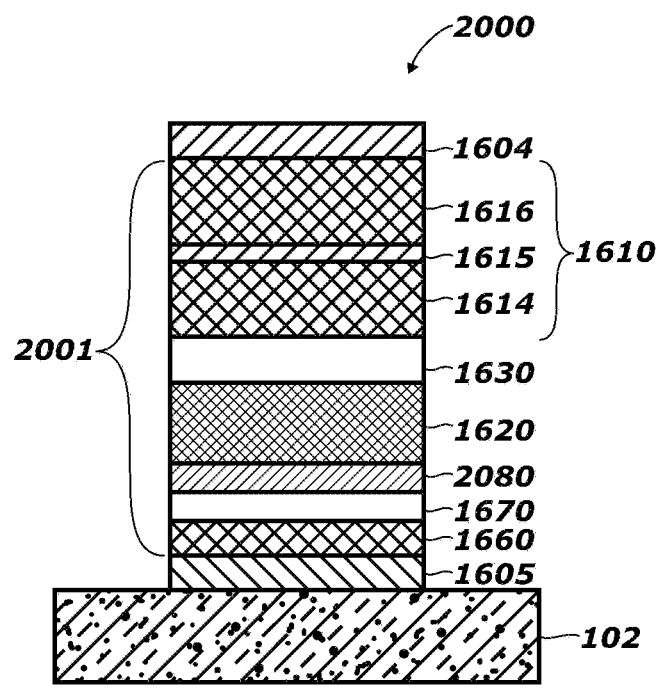
FIG. 20 is a cross-sectional, elevational, schematic illustration of a magnetic cell structure comprising a thicker attracter region compared to the magnetic cell structure of FIG. 18.

With reference to FIG. 20, another magnetic cell structure 2000 was evaluated. The magnetic cell structure 2000 included a magnetic cell core 2001 having the same structure as the magnetic cell core 1801 (FIG. 18), but with a thicker attracter region 2080. The attracter region 2080 was formed of tantalum (Ta), to a thickness of 5 Å (0.5 nm) (compared to the 3 Å (0.3 nm) attracter region 1880 (FIG. 18)), between the secondary oxide region 1670 and the free region 1620. The magnetic cell structure 2000, with the thicker attracter region 2080, was found to have a TMR of about 77%, an RA of about 11 $\Omega \cdot \mu m^2$, and an Hk of about 2,300 Oe (about 183.0 kA/m) (compared to the 42% TMR, the 15 $\Omega \cdot \mu m^2$, and the 2,276 Oe (181.1 kA/m) of the magnetic cell structure 1800 of FIG. 18). Thus, increasing the thickness of the attracter region 2080 yielded an increase in the TMR.

Figure 21:
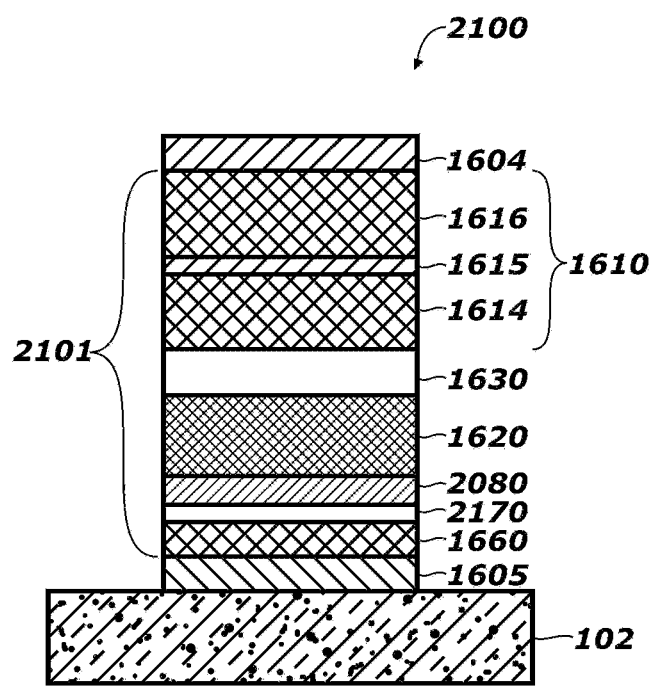
FIG. 21 is a cross-sectional, elevational, schematic illustration of a magnetic cell structure comprising a thinner oxide region, proximate to the attracter region, compared to the magnetic cell structure of FIG. 20.
Figure 22:
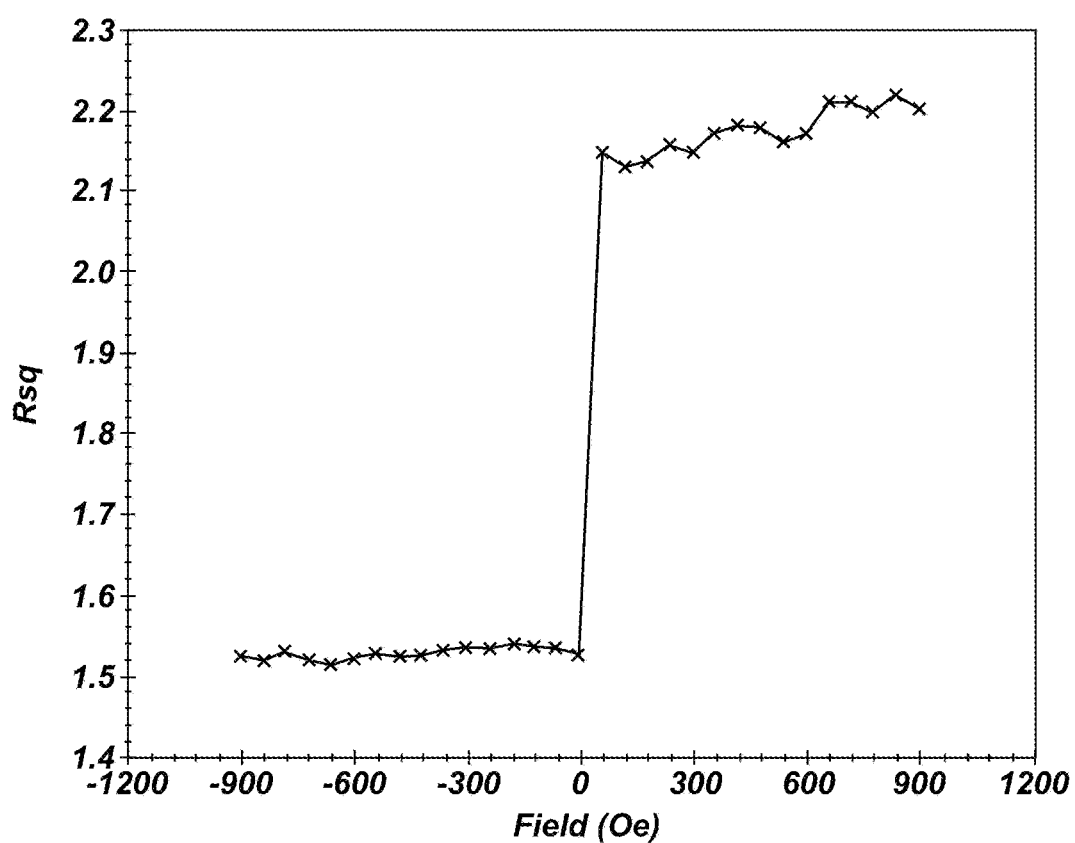
FIG. 22 is an R-H loop plot of the magnetic cell structure of FIG. 21.

With reference to FIGS. 21 and 22, another magnetic cell structure 2100 was evaluated. The magnetic cell structure 2100 included a magnetic cell core 2101 having the same structure as the magnetic cell core 2001 (FIG. 20), but with a thinner secondary oxide region 2170. The secondary oxide region 2170 was formed of magnesium oxide (MgO) to a thickness of about 3 Å (about 0.3 nm) (compared to the about 5 Å (about 0.5 nm) secondary oxide region 1670 of FIG. 20). The magnetic cell structure 2100, with the thicker attracter region 2080 and the thinner secondary oxide region 2170, was found to have a TMR of about 130% (see the R-H loop plot of FIG. 22), an RA of about 6.9 $\Omega \cdot \mu m^2$, and an Hk of about 1,500 Oe (about 119.4 kA/m). Thus, decreasing the thickness of the secondary oxide region 2170 substantially increased the TMR (130%, compared to the TMR of about 77% for the magnetic cell structure 2000 of FIG. 20), while still maintaining a strong MA strength (e.g., an Hk of about 1,500 Oe (about 119.4 kA/m), though the MA strength was less than that of the magnetic cell structure 2000 (FIG. 20) (about 2,300 Oe (about 183.0 kA/m))).

Another magnetic cell structure (not illustrated) having the secondary oxide region 2170 (FIG. 21) (i.e., MgO of about 3 Å (about 0.3 nm) in thickness) and the attracter region 1880 (FIG. 18) (i.e., Ta of 3 Å (0.3 nm) in thickness) was also evaluated for MA strength and found to have an Hk of about 1,200 Oe (about 95.5 kA/m). Thus, decreasing the thickness of the attracter region 1880 separating the secondary oxide region 2170 from the free region 1620 decreased MA strength.

Accordingly, including an attracter material proximate to a free region, even between the free region and an MA-inducing oxide region, may increase TMR without degrading MA strength. In some embodiments, TMR values of above 100% and strong MA values (e.g., at least about 1,500 Oe (above about 119.4 kA/m)) may be achieved.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A semiconductor device, comprising:
   a structure between a lower electrode and an upper electrode, the structure comprising:
      an intermediate oxide region between a free region and a fixed region;
      another oxide region adjacent the free region, the other oxide region comprising a nonmagnetic oxide material; and
      an attracter material in direct physical contact with the free region and with the nonmagnetic oxide material of the other oxide region, the attracter material chemically bonded to a diffused species diffused from a magnetic material of the free region.

2. The semiconductor device of claim 1, wherein the free region is above the fixed region and above the lower electrode.

3. The semiconductor device of claim 1, wherein the free region is configured as a homogeneous region of the magnetic material.

4. The semiconductor device of claim 1, wherein the attracter material exhibits a crystalline structure.

5. The semiconductor device of claim 1, wherein the attracter material is integrated in the other oxide region.

6. The semiconductor device of claim 1, wherein the fixed region is not in physical contact with the attracter material of the structure.

7. The semiconductor device of claim 1, wherein the free region and the fixed region are above the other oxide region, the attracter material, and the lower electrode.

8. The semiconductor device of claim 1, wherein the free region and the fixed region are below the other oxide region, the attracter material, and the upper electrode.

9. The semiconductor device of claim 1, wherein the diffused species consists of boron.

10. The semiconductor device of claim 1, wherein the attracter material comprises at least one of tantalum (Ta), tungsten (W), hafnium (Hf), and zirconium (Zr).

11. A semiconductor device comprising at least one structure extending vertically from a substrate, the at least one structure comprising:
   a nonmagnetic region between a magnetic region and another magnetic region, the magnetic region exhibiting a switchable vertical magnetic orientation, the other magnetic region exhibiting a fixed vertical magnetic orientation;
   an attracter region directly adjacent the magnetic region and comprising an attracter material and a species diffused from the magnetic region; and
   an oxide material in or adjacent the attracter region.

12. The semiconductor device of claim 11, wherein the attracter region defines a height of less than about 0.6 nanometers.

13. The semiconductor device of claim 11, wherein:
   the attracter material consists of tantalum (Ta), and
   the species diffused from the magnetic region is boron.

14. The semiconductor device of claim 11, wherein the attracter region further comprises the oxide material.

15. The semiconductor device of claim 11, wherein the nonmagnetic region is directly between the magnetic region and the other magnetic region.

16. A method of forming a semiconductor device, the method comprising:
   forming a precursor structure on a substrate, comprising:
      forming a magnetic material above a conductive material supported by the substrate;
      forming a nonmagnetic oxide material above the magnetic material;
      forming another magnetic material above the nonmagnetic oxide material;
      forming another nonmagnetic oxide material adjacent one of the magnetic material and the other magnetic material; and
      forming an attracter material in direct physical contact with the one of the magnetic material and the other magnetic material and in direct physical contact with the other nonmagnetic oxide material;
   annealing at least a portion of the precursor structure to diffuse a species from the one of the magnetic material and the other magnetic material, the species chemically bonding with the attracter material once the species diffuses; and
   patterning the precursor structure to form at least one structure of the semiconductor device.

17. The method of claim 16:
   further comprising forming a foundation material above the substrate; and
   wherein forming the attracter material comprises forming the attracter material directly above the foundation material.

18. The method of claim 17, wherein forming a foundation material comprises forming a CoFeB material.

19. The method of claim 16, wherein:
   forming an attracter material comprises forming the attracter material above the other magnetic material; and forming another nonmagnetic oxide material comprises forming the other nonmagnetic oxide material above the attracter material.

20. The method of claim 16, wherein:

forming an attracter material comprises forming the attracter material above the conductive material; and forming the magnetic material follows forming the attracter material and comprises forming the magnetic material above the attracter material.

\* \* \* \* \*